United States Patent
Lee et al.

(10) Patent No.: US 9,503,097 B2
(45) Date of Patent: *Nov. 22, 2016

(54) ANALOG CIRCUITS INCORPORATING MAGNETIC LOGIC UNITS

(71) Applicant: Crocus Technology Inc., Santa Clara, CA (US)

(72) Inventors: Douglas J. Lee, San Jose, CA (US); Yaron Oren-Pines, San Jose, CA (US); Stuart Desmond Rumley, Redwood City, CA (US); Seyed A. Tabatabaei, Mountain View, CA (US); Bertrand F. Cambou, Palo Alto, CA (US)

(73) Assignee: Crocus Technology Inc., Santa Clara, CA (US)

( * ) Notice: Subject to any disclaimer, the term of this patent is extended or adjusted under 35 U.S.C. 154(b) by 25 days.

This patent is subject to a terminal disclaimer.

(21) Appl. No.: 14/606,967

(22) Filed: Jan. 27, 2015

(65) Prior Publication Data

US 2015/0214953 A1 Jul. 30, 2015

Related U.S. Application Data

(60) Provisional application No. 61/932,694, filed on Jan. 28, 2014.

(51) Int. Cl.
*H01L 21/822* (2006.01)
*H03K 19/18* (2006.01)
*G11C 11/16* (2006.01)

(52) U.S. Cl.
CPC .............. *H03K 19/18* (2013.01); *G11C 11/16* (2013.01); *H01L 21/822* (2013.01)

(58) Field of Classification Search
CPC ............................ H01L 21/822; H03K 19/18
USPC ..................................... 365/1, 5, 32
See application file for complete search history.

(56) References Cited

U.S. PATENT DOCUMENTS 5,936,458 A * 8/1999 Rylov ................ H03K 3/38
327/528
7,918,244 B2 * 4/2011 Prakash ............ F16K 99/0001
137/806

(Continued)

FOREIGN PATENT DOCUMENTS

CN 201697638 U 1/2011
CN 201748938 U 2/2011

OTHER PUBLICATIONS

Leem et al., Magnetic Coupled Spin-torque Devices and Magnetic Ring Oscillator, Jan. 2009, Stanford University.*

(Continued)

*Primary Examiner* — Thomas J Hiltunen
(74) *Attorney, Agent, or Firm* — Cooley LLP

(57) ABSTRACT

A circuit includes a magnetic logic unit including input terminals, output terminals, a field line, and magnetic tunnel junctions (MTJs). The field line electrically connects a first and a second input terminal, and is configured to generate a magnetic field based on an input to at least one of the first and the second input terminal. The input is based on a first analog input to the circuit. Each MTJ is electrically connected to a first and a second output terminal, and is configured such that an output of at least one of the first and the second output terminal varies in response to a combined resistance of the MTJs. The resistance of the MTJs varies based on the magnetic field. The circuit is configured to mix the first analog input and a second analog input to generate an analog output based on the output of the second output terminal.

19 Claims, 27 Drawing Sheets

(56) References Cited

U.S. PATENT DOCUMENTS

| | | | | |
|---|---|---|---|---|
| 8,198,919 B1* | 6/2012 | Kozhanov | ............ | H01F 10/3254 326/104 |
| 8,344,758 B2* | 1/2013 | Javerliac | ................. | G06F 7/501 326/101 |
| 8,558,571 B2* | 10/2013 | Behin-Aein | ........... | H03K 19/16 326/104 |
| 8,598,957 B2* | 12/2013 | Lee | ...................... | H03B 15/006 331/187 |
| 8,872,547 B2* | 10/2014 | Becherer | ................. | H01L 29/82 326/104 |
| 8,933,750 B2* | 1/2015 | Cambou | ................. | H03F 15/00 330/62 |
| 9,228,855 B2* | 1/2016 | Cambou | ................. | G01R 33/096 |
| 2005/0117392 A1 | 6/2005 | Hayakawa et al. | | |
| 2007/0223270 A1 | 9/2007 | Hung et al. | | |
| 2011/0044099 A1 | 2/2011 | Dieny | | |
| 2011/0108937 A1 | 5/2011 | Reid | | |
| 2013/0241536 A1 | 9/2013 | Cambou et al. | | |
| 2013/0241636 A1 | 9/2013 | Cambou et al. | | |
| 2013/0277781 A1 | 10/2013 | Deak et al. | | |
| 2013/0300409 A1 | 11/2013 | Deak et al. | | |
| 2013/0334634 A1 | 12/2013 | Deak et al. | | |
| 2013/0335073 A1 | 12/2013 | Deak et al. | | |
| 2014/0035570 A1 | 2/2014 | Jin et al. | | |
| 2014/0035573 A1 | 2/2014 | Deak et al. | | |
| 2015/0091111 A1* | 4/2015 | Friedman | ................. | H01L 27/22 257/421 |
| 2015/0214952 A1* | 7/2015 | Lee | ........................ | H03K 19/18 326/101 |
| 2015/0214953 A1* | 7/2015 | Lee | ........................ | G11C 11/16 327/510 |
| 2016/0018479 A1* | 1/2016 | Cambou | ............... | G01R 33/098 324/252 |
| 2016/0018480 A1* | 1/2016 | Cambou | ............... | G01R 33/093 324/252 |
| 2016/0018481 A1* | 1/2016 | Cambou | ............... | G01R 33/098 324/252 |
| 2016/0018482 A1* | 1/2016 | Yehoshua | ............ | G01R 33/098 324/252 |
| 2016/0018483 A1* | 1/2016 | Oren-Pines | .......... | G01R 33/098 324/252 |

OTHER PUBLICATIONS

International Search Report and Written Opinion issued to international patent application No. PCT/US2015/013138, Apr. 9, 2015, 10 pgs.

\* cited by examiner

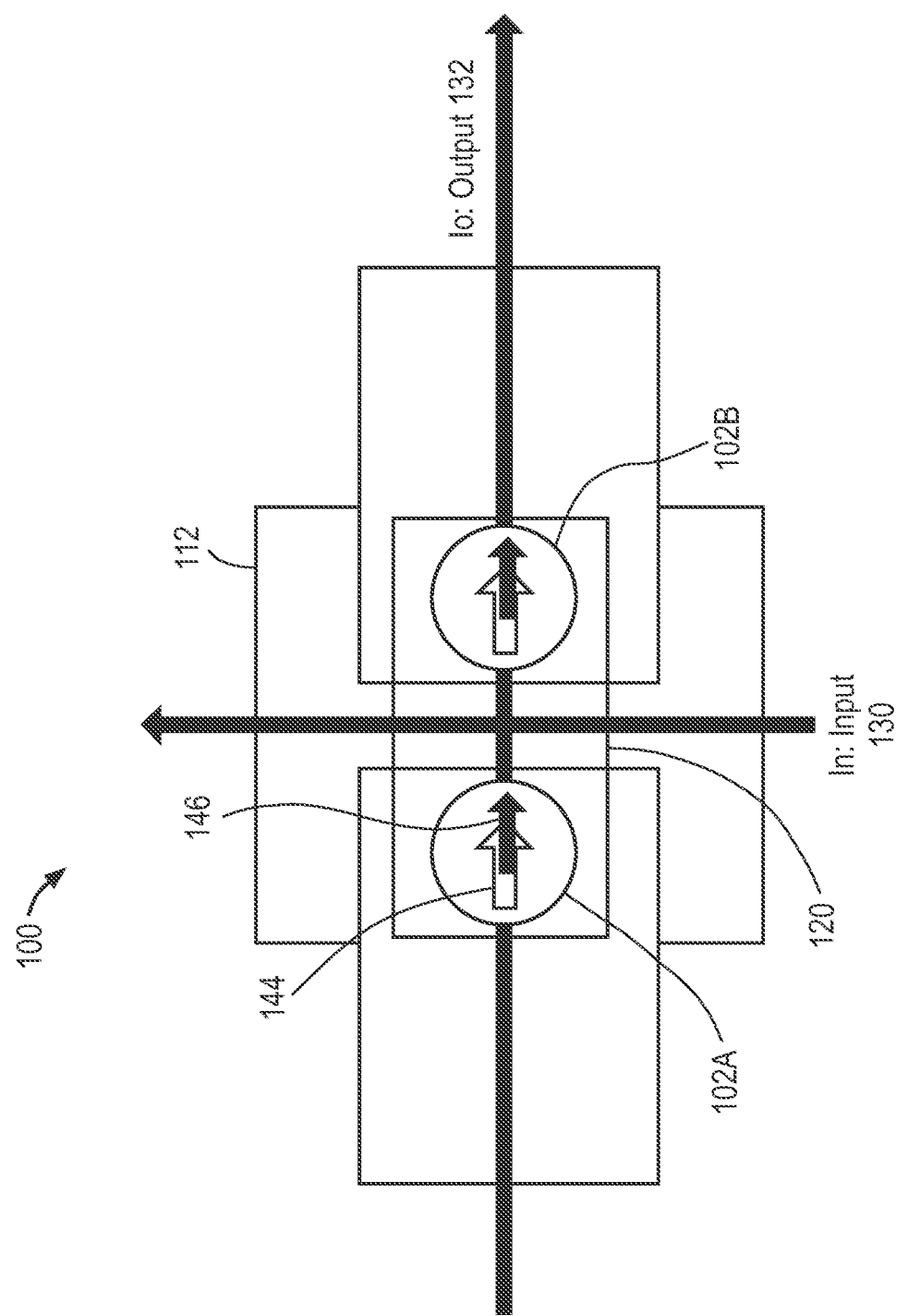

ANALOG CIRCUITS INCORPORATING MAGNETIC LOGIC UNITS

CROSS REFERENCE TO RELATED APPLICATIONS

This application claims priority to U.S. Provisional Patent Application No. 61/932,694 filed on Jan. 28, 2014. The contents of which are incorporated herein by reference.

FIELD OF THE INVENTION

The invention relates generally to magnetic logic units and, more particularly, to analog circuits incorporating magnetic logic units.

BACKGROUND

Traditional active devices used in analog circuits are typically three-terminal devices that can rely on bipolar junctions or voltage field effects. Semiconductor and thermionic devices typically have one terminal in common with both the input and the output. For example, field effect transistor (FET) circuit topologies are often characterized as being common-source, common-gate, or common-drain. Bipolar topologies are often characterized as common-emitter, common-base, and common collector. Vacuum tube circuits can be common-cathode, common-grid (grounded base), or common-anode (grounded plate).

These conventional active devices may also have characteristics that limit their performance. For example, these devices may have significant coupling capacitance between the input and the output, such as due to the Miller effect. This capacitance may limit switching speed and bandwidth of these devices, such as when used in analog power amplifiers. The power added efficiency of these amplifiers may be limited by transistor characteristics. Also, these devices have 1/f noise, which may impact noise figure of these devices. Furthermore, when multiple ones of these devices are placed in close proximity, circuit design complexity may be increased in an effort to avoid latch-up conditions.

In addition, these active devices are fabricated with multiple types of distinct structures. For example, bipolar junction transistors and metal-oxide semiconductor FETs (MOSFETs) may be fabricated as n/p type devices. Because these active devices are typically three-terminal devices, for a particular type of device structure, current flows in a well-defined direction when the device is "on". To support circuit building blocks that include complementary pairs of these devices, such as "push-pull" circuits, one or more devices of each type, such as n-type MOSFETs, are coupled to one or more devices of the other type, such as p-type MOSFETs. It would be desirable to be able to support these circuit building blocks with a device that is sufficiently flexible to do so with a single type of structure.

Moreover, analog circuits including these active devices may be fabricated using complementary MOS (CMOS) processes with upwards of twelve layers, which adds to both cost and size of these analog circuits.

It is against this background that a need arose to develop the analog circuits incorporating magnetic logic units and related methods described herein.

SUMMARY OF THE INVENTION

A circuit includes a magnetic logic unit including input terminals, output terminals, a field line, and magnetic tunnel junctions (MTJs). The field line electrically connects a first and a second input terminal, and is configured to generate a magnetic field based on an input to at least one of the first and the second input terminal. The input is based on a first analog input to the circuit. Each MTJ is electrically connected to a first and a second output terminal, and is configured such that an output of at least one of the first and the second output terminal varies in response to a combined resistance of the MTJs. The resistance of the MTJs varies based on the magnetic field. The circuit is configured to mix the first analog input and a second analog input to generate an analog output based on the output of the second output terminal.

BRIEF DESCRIPTION OF THE FIGURES

FIG. 3 is a top view of the magnetic logic unit (MLU) circuit module 100 corresponding to the perspective view of FIG. 1.

DETAILED DESCRIPTION

Definitions

The following definitions apply to some of the aspects described with respect to some embodiments of the invention. These definitions may likewise be expanded upon herein.

As used herein, the singular terms "a," "an," and "the" include plural referents unless the context clearly dictates otherwise. Thus, for example, reference to an object can include multiple objects unless the context clearly dictates otherwise.

As used herein, the term "set" refers to a collection of one or more objects. Thus, for example, a set of objects can include a single object or multiple objects. Objects of a set also can be referred to as members of the set. Objects of a set can be the same or different. In some instances, objects of a set can share one or more common characteristics.

As used herein, the terms "substantially" and "substantial" refer to a considerable degree or extent. When used in conjunction with an event or circumstance, the terms can refer to instances in which the event or circumstance occurs precisely as well as instances in which the event or circumstance occurs to a close approximation, such as accounting for typical manufacturing tolerances or variability of the embodiments described herein.

As used herein, the term "adjacent" refers to being near or adjoining. Adjacent objects can be spaced apart from one another or can be in actual or direct contact with one another. In some instances, adjacent objects can be formed integrally with one another.

As used herein, the terms "connect," "connected," and "connection" refer to an operational coupling or linking. Connected objects can be directly coupled to one another or can be indirectly coupled to one another, such as via another set of objects.

As used herein, the term "main group element" refers to a chemical element in any of Group IA (or Group 1), Group IIA (or Group 2), Group IIIA (or Group 13), Group IVA (or Group 14), Group VA (or Group 15), Group VIA (or Group 16), Group VIIA (or Group 17), and Group VIIIA (or Group 18). A main group element is also sometimes referred to as a s-block element or a p-block element.

As used herein, the term "transition metal" refers to a chemical element in any of Group IVB (or Group 4), Group VB (or Group 5), Group VIB (or Group 6), Group VIIB (or Group 7), Group VIIIB (or Groups 8, 9, and 10), Group IB (or Group 11), and Group IIB (or Group 12). A transition metal is also sometimes referred to as a d-block element.

As used herein, the term "rare earth element" refers to any of Sc, Y, La, Ce, Pr, Nd, Pm, Sm, Eu, Gd, Tb, Dy, Ho, Er, Tm, Yb, and Ru.

DETAILED DESCRIPTION OF EMBODIMENTS OF THE INVENTION

Figure 1:
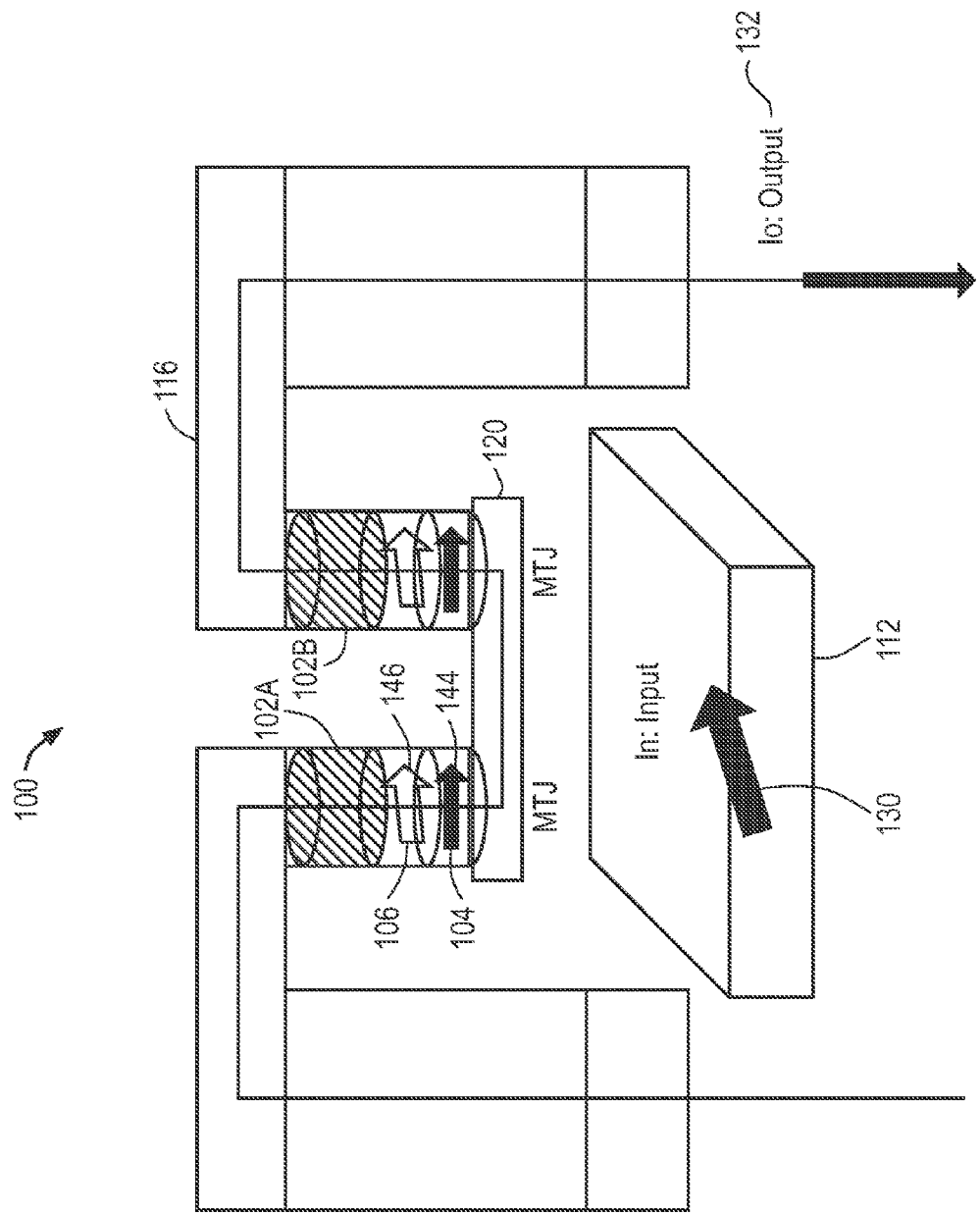
FIG. 1 illustrates a perspective view of a magnetic logic unit (MLU) circuit module 100 configured in accordance with an embodiment of the invention.
Figure 2A:
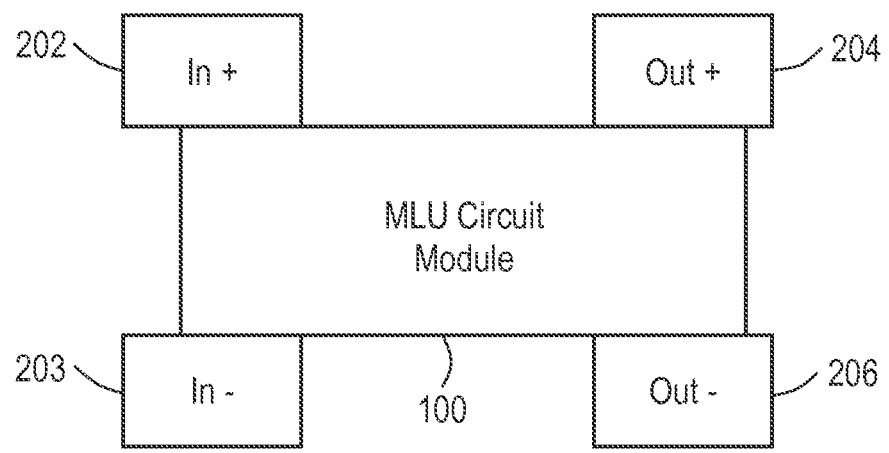
FIG. 2A illustrates a logical block diagram of an MLU circuit module 100 configured in accordance with an embodiment of the invention.
Figure 2B:
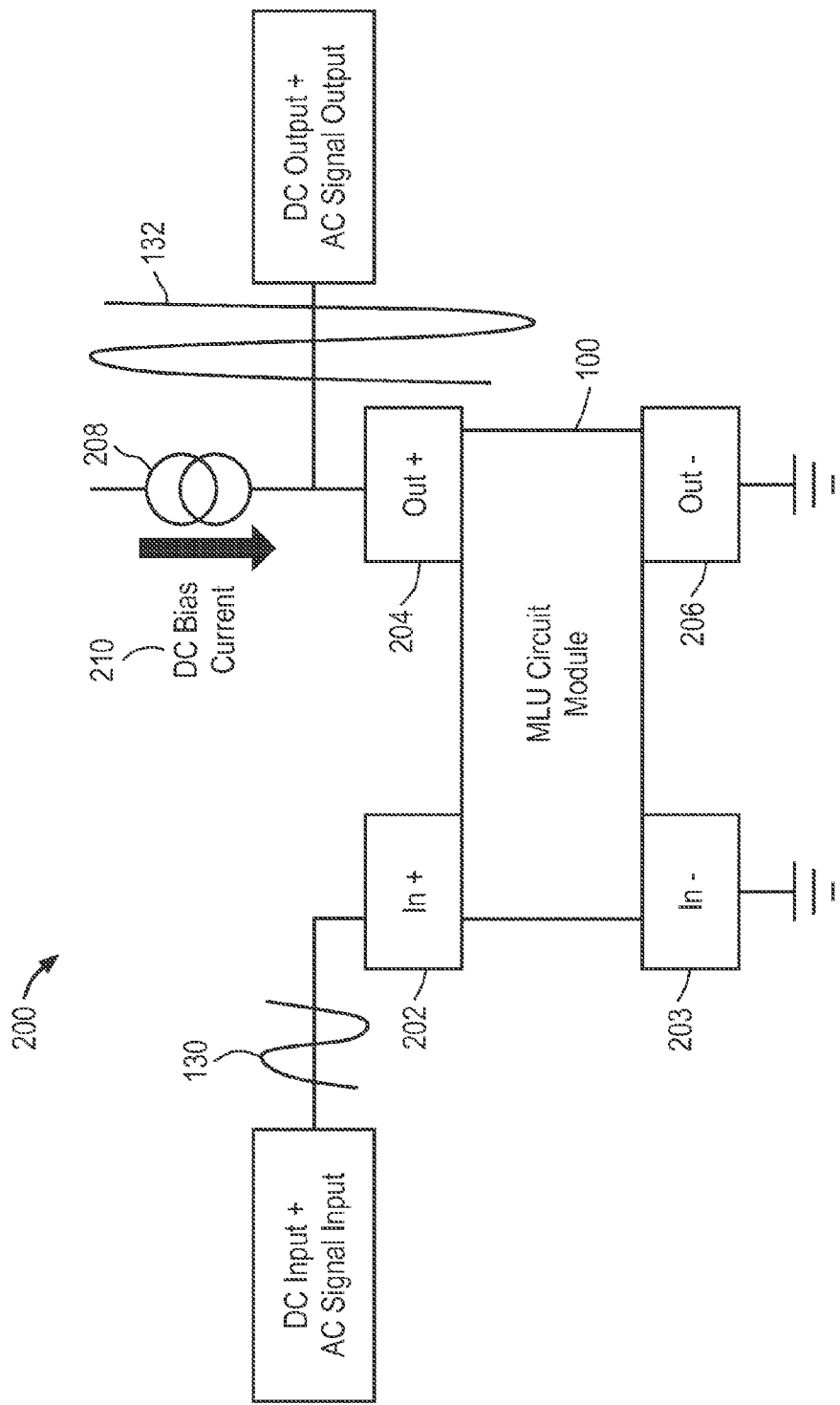
FIG. 2B illustrates a logical block diagram of an MLU-based amplifier 200 including the MLU circuit module 100 according to an embodiment of the invention.

FIG. 1 illustrates a perspective view of a magnetic logic unit (MLU) circuit module 100, according to an embodiment of the invention. FIG. 2A illustrates a logical block diagram of an MLU circuit module 100, according to an embodiment of the invention. FIG. 2B illustrates a logical block diagram of an MLU-based amplifier 200 including the MLU circuit module 100, according to an embodiment of the invention. FIG. 3 illustrates a top view of the magnetic logic unit (MLU) circuit module 100 corresponding to the perspective view of FIG. 1, according to an embodiment of the invention. Referring to FIGS. 1 through 3, the MLU circuit module 100 may include one or more MLU's 102. For example, referring to FIG. 7, arrays of large numbers of MLU's 102 are contemplated. In the embodiment of FIG. 1, MLU's 102A and 102B are shown connected by a conductive strap 120. MLU's may be implemented as magnetic tunnel junctions (MTJ's).

The MLU circuit module 100 may be an N-terminal device, where N is four, five, six, or a larger integer number of terminals. Referring to FIG. 2A, in one embodiment the MLU circuit module 100 may be a four-terminal device having input terminals 202 and 203 and output terminals 204 and 206. None of these four terminals is in common with any other of these four terminals. (For example, neither of the input terminals 202 and 203 need to share a ground connection with either of the output terminals 204 and 206.) Each of the four terminals may be concurrently connected to distinct portions of a surrounding circuit.

The MLU-based amplifier 200 shown in FIG. 2B is one example of how the MLU circuit module 100 can be used as a building block of analog circuits. Referring to FIGS. 1 and 2B, an input signal 130 may be applied to the MLU-based amplifier 200 through a field line 112 that controls a first terminal 202 that modulates a resistance of each of the MLU's 102, and also a combined resistance of the MLU circuit module 100. For example, the input signal 130 may be an input current that flows through the field line 112, where the input current generates a magnetic field that couples to each of the MLU's 102 to modulate the resistance of each of the MLU's 102. An amplified output signal 132 of the MLU-based amplifier 200 may flow through output line 116, and may be measured across output terminals 204 and 206. The MLU-based amplifier 200 may include bias circuitry that supplies DC power, and that facilitates setting an input-output transfer characteristic and an operating point for the amplifier, such as by setting the DC input current. The bias circuitry may include circuitry 208 that supplies a DC bias current 210 to facilitate generation of the output signal 132. However, the MLU circuit module 100 itself may not contain any silicon transistors, as none are needed to drive each MLU 102. The MLU circuit module 100 may be solely driven externally through its input and output terminals.

Referring to FIGS. 1 and 2B, an individual MLU 102 implemented as a single MTJ cell may, in one example, have a power gain of about −2 dB. At the same time, the feed forward coupling capacitance between input and output of each MLU 102 is very small. To increase the gain of the MLU-based amplifier 200 while maintaining a very small coupling capacitance, many MLU's 102 may be linked together. In one embodiment, arrays of magnetic logic units (MLU's) 102 are used to design MLU-based amplifiers of large gains and extended cutoff frequencies.

Referring to FIGS. 1, 2A, and 11-25, various circuit configurations including the MLU circuit module 100 distinct from the configuration shown in FIG. 2B are contemplated. For example, as shown in FIGS. 11-25, the various circuit configurations including the MLU circuit module 100 include analog circuit building blocks for circuits such as amplifiers, current sources, oscillators, mixers, and motor drivers. These circuit configurations have topologies that take advantage of the MLU circuit module 100 being an N-terminal device, where N is four or larger. For example, input currents to the MLU circuit module 100 may be concurrently provided to both input terminals 202 and 203, such as in distributed mixer 1700 of FIG. 17, in which RF input current 1702 and input bias current 1704 are provided to a first input terminal, and local oscillator input current 1708 is provided to a second input terminal. These input currents may include both DC bias currents and AC signal input currents. Alternatively, the DC bias current may be provided to one of the input terminals 202 and 203. In one embodiment, the input DC bias currents may be configured such that the input-output transfer characteristic and the operating point of the MLU circuit module 100 are different for each of the AC signal input currents to the input terminals 202 and 203, such as in the MLU-based operational amplifier 1800 of FIG. 18. In another example, one of the output terminals 204 and 206 of the MLU circuit module 100 may be connected to one of the input terminals 202 and 203 of the MLU circuit module 100, such as in oscillator 2300 of FIG. 23. In another example, MLU circuit modules 100 that have the same type of structure are connected as a complementary pair of devices, such as in push-pull stage 1900 of FIG. 19.

Referring to FIGS. 1 and 3, the MLU 102 can be implemented with one magnetization, namely a storage magnetization 146, that is aligned in a particular stored direction. The MLU 102 can be implemented with another magnetization, namely a sense magnetization 144, that is aligned by a magnetic field generated by the input current corresponding to the input signal 130. This type of MLU 102 is known as self-referenced. Alternatively, the MLU 102 can be implemented with the storage magnetization 146 and a reference magnetization.

The MLU 102 includes a sense layer 104, a storage layer 106, and a layer 908 (see FIG. 4) that is disposed between the sense layer 104 and the storage layer 106. Other implementations of the MLU 102 are contemplated. For example, the relative positioning of the sense layer 104 and the storage layer 106 can be reversed, with the storage layer 106 disposed below the sense layer 104.

Figure 4:
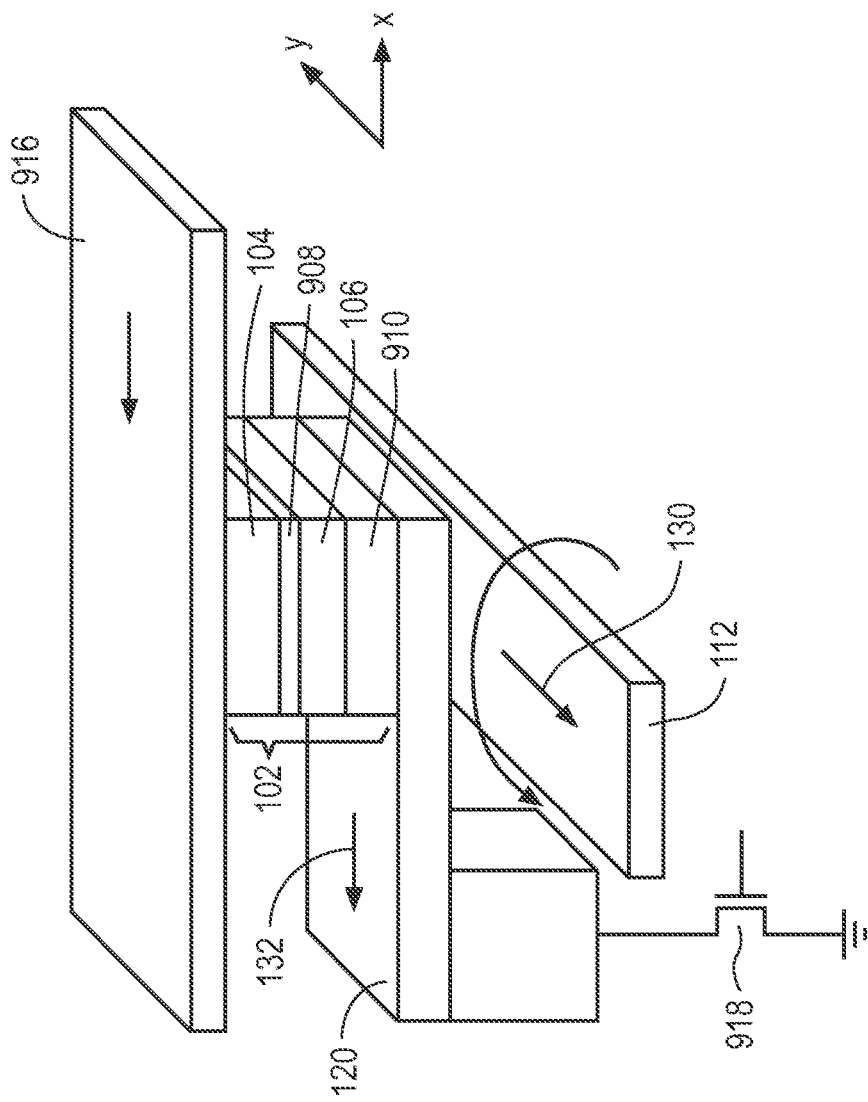
FIG. 4 illustrates a perspective view of the MLU 102 and supporting circuitry that may be included in the MLU circuit module 100 according to an embodiment of the invention.

FIG. 4 illustrates a perspective view of the MLU 102 and supporting circuitry that may be included in the MLU circuit module 100, according to an embodiment of the invention. Referring to FIGS. 1 and 4, each of the sense layer 104 and the storage layer 106 includes, or is formed of, a magnetic material and, in particular, a magnetic material of the ferromagnetic type. A ferromagnetic material can be characterized by a substantially planar magnetization with a particular coercivity, which is indicative of a magnitude of a magnetic field to reverse the magnetization after it is driven to saturation in one direction. In general, the sense layer 104 and the storage layer 106 can include the same ferromagnetic material or different ferromagnetic materials.

As illustrated in FIG. 1, the sense layer 104 can include a soft ferromagnetic material, namely one having a relatively low coercivity, while the storage layer 106 can include a hard ferromagnetic material, namely one having a relatively high coercivity. In such manner, a magnetization of the sense layer 104 can be readily varied under low-intensity magnetic fields generated in response to the input signal 130, while a magnetization of the storage layer 106 remains stable. Suitable ferromagnetic materials include transition metals, rare earth elements, and their alloys, either with or without main group elements. For example, suitable ferromagnetic materials include iron ("Fe"), cobalt ("Co"), nickel ("Ni"), and their alloys, such as permalloy (or $Ni_{80}Fe_{20}$); alloys based on Ni, Fe, and boron ("B"); $Co_{90}Fe_{10}$; and alloys based on Co, Fe, and B. In some instances, alloys based on Ni and Fe (and optionally B) can have a smaller coercivity than alloys based on Co and Fe (and optionally B). A thickness of each of the sense layer 104 and the storage layer 106 can be in the nm range, such as from about 1 nm to about 20 nm or from about 1 nm to about 10 nm. Other implementations of the sense layer 104 and the storage layer 106 are contemplated. For example, either, or both, of the sense layer 104 and the storage layer 106 can include multiple sub-layers in a fashion similar to that of the so-called synthetic antiferromagnetic layer.

In another embodiment, the MLU 102 may include the storage layer 106 and a reference layer instead of the sense layer 104, with the layer 908 disposed between the storage layer 106 and the reference layer. Each of the reference layer and the storage layer 106 includes, or is formed of, a magnetic material and, in particular, a magnetic material of the ferromagnetic type, the characteristics of which are described previously with reference to FIG. 1. In general, the reference layer and the storage layer 106 can include the same ferromagnetic material or different ferromagnetic materials. The reference layer is different from the sense layer 104 in that the reference layer typically has a high coercivity, such as a coercivity higher than the storage layer 106.

The layer 908 functions as a tunnel barrier, and includes, or is formed of, an insulating material. Suitable insulating materials include oxides, such as aluminum oxide (e.g., $Al_2O_3$) and magnesium oxide (e.g., MgO). A thickness of the layer 908 can be in the nm range, such as from about 1 nm to about 10 nm.

Referring to FIGS. 1 and 4, the MLU 102 also includes the pinning layer 910, which is disposed adjacent to the storage layer 106 and, through exchange bias, stabilizes the storage magnetization along a particular one of the pair of directions when a temperature within, or in the vicinity of, the pinning layer 910 is lower than a temperature $T_{BS}$. The temperature $T_{BS}$ can correspond to a blocking temperature, a Neel temperature, or another threshold temperature. The pinning layer 910 unpins, or decouples, the storage magnetization direction when the temperature is at, or above, the blocking temperature $T_{BS}$, thereby allowing the storage magnetization direction to be switched to another one of the pair of directions.

In one embodiment, such a pinning layer is omitted adjacent to the sense layer 104, and, as a result, the sense layer 104 has a sense magnetization direction that is unpinned and is readily varied, with the substantial absence of exchange bias.

In another embodiment, as previously described, the MLU 102 includes a reference layer instead of the sense layer 104. In this embodiment, an additional pinning layer may be disposed adjacent to the reference layer. This additional pinning layer may be characterized by a threshold temperature $T_{BR}$, with $T_{BR} > T_{BS}$. The temperature $T_{BR}$ can correspond to a blocking temperature, a Neel temperature, or another threshold temperature. Through exchange bias, this additional pinning layer stabilizes the reference magnetization along a substantially fixed direction at temperatures lower than the threshold temperature $T_{BR}$.

The pinning layer 910 (and the additional pinning layer disposed adjacent to the reference layer in the alternative embodiment) includes, or is formed of, a magnetic material and, in particular, a magnetic material of the antiferromagnetic type. Suitable antiferromagnetic materials include transition metals and their alloys. For example, suitable antiferromagnetic materials include alloys based on manganese ("Mn"), such as alloys based on iridium ("Ir") and Mn (e.g., IrMn); alloys based on Fe and Mn (e.g., FeMn); alloys based on platinum ("Pt") and Mn (e.g., PtMn); and alloys based on Ni and Mn (e.g., NiMn). In some instances, the blocking temperature $T_{BS}$ of alloys based on Ir and Mn (or based on Fe and Mn) can be in the range of about 120° C. to about 220° C. or about 150° C. to about 200° C., such as about 200° C., and can be smaller than the blocking temperature $T_{BS}$ of alloys based on Pt and Mn (or based on Ni and Mn), which can be in the range of about 300° C. to about 350° C.

Figure 5:
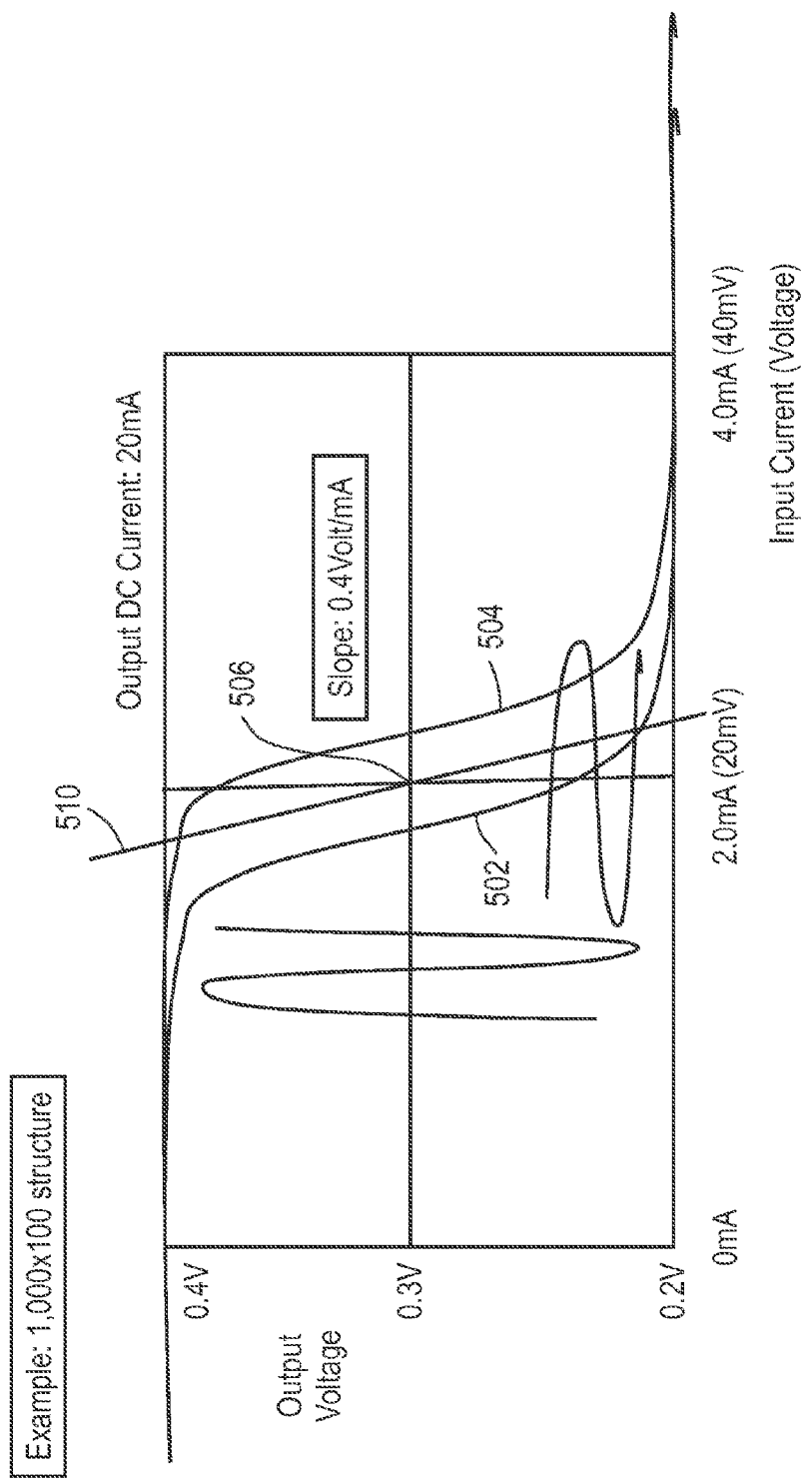
FIG. 5 illustrates an example of a response curve (an input-output transfer characteristic) relating the output signal 132 of the MLU-based amplifier 200 to the input signal 130, according to an embodiment of the invention.

Referring to FIGS. 1, 2A, 2B, and 4, thermally assisted switching (TAS) technology, as applied to MLU's 102, provides one way of implementing a device with a resistance that varies in response to the input signal 130 for use in analog circuits, as explained herein. FIG. 5 illustrates an example of a response curve (an input-output transfer characteristic) relating the output signal 132 of the MLU-based amplifier 200 to the input signal 130, according to an embodiment of the invention. The below discussion of FIG. 5 illustrates the input-output transfer characteristic of the MLU circuit module 100, and is applicable to MLU circuit modules 100 included in any of the analog circuits described herein. In the example of FIG. 5, the MLU circuit module 100 includes an array of MLU's 102 with 1,000 parallel rows of MLU's 102, each row having 10 MLU's 102 in series (see, for example, FIG. 7 with Np equal to 1,000 and Ns equal to 10), and the output signal 132 of the MLU-based amplifier 200 is measured across the MLU circuit module 100.

In one embodiment, the input signal 130 to input terminal 202 of the MLU circuit module 100 may flow through one or more field lines 112 such that a magnetic field generated by the input signal 130 is coupled to each of the MLU's 102. Alternatively or in addition, another input signal to input terminal 203 of the MLU circuit module 100 may flow in the opposite direction through the one or more field lines 112 such that a magnetic field generated by the another input signal is also coupled to each of the MLU's 102. In one embodiment, the field line 112 may be positioned about 50 nm underneath the strap 120.

When the input signal 130 is zero (e.g., zero input current assuming that the input signal 130 to the input terminal 202 is the only input to the MLU circuit module 100), the sense magnetization 144 and the storage magnetization 146 of the MLU 102 are naturally substantially anti-aligned (e.g., substantially antiparallel), resulting in a series resistance of 2 KΩ per MLU 102 included in the MLU circuit module 100. When the input signal 130 is sufficiently small (e.g., less than a value in the range from about 1.5 mA to about 1.75 mA in the example shown in FIG. 5), the sense magnetization 144 and the storage magnetization 146 of the MLU 102 remain substantially antiparallel, resulting in a series resistance of about 2 KΩ per MLU 102. When the input signal 130 is sufficiently large (greater than a value in the range from about 2.25 mA to about 2.5 mA in the example shown in FIG. 5), the sense magnetization 144 becomes substantially aligned (e.g., substantially parallel) with the storage magnetization 146, resulting in a series resistance of about 1 KΩ per MLU 102. It is contemplated that these resistance values, and in particular the ratio between these resistance values, may be varied for other embodiments of the MLU 102 based on forming the sense layer 104, the storage layer 106, and/or the layer 108 from different choices of materials, material concentrations, and/or material thicknesses.

In the example of FIG. 5, and also referring to FIG. 2, the input signal 130 includes 2 mA DC current along with the AC input signal. The variations in the input signal 130 due to the AC input signal result in variations in the resistances of each MLU 102 magnetically connected to the field line 112, and therefore in a variation of the combined resistance of the MLU's 102 included in the MLU circuit module 100. The DC bias current 210 flows through the MLU circuit module 100, generating an output voltage based on the variation of the combined resistance of the MLU's 102 included in the MLU circuit module 100. The output signal 132 may be this output voltage signal, or alternatively may be an output current signal generated based on this output voltage signal. The response curve relating the output signal 132 of the MLU-based amplifier 200 to the input signal 130 has a substantially linear region 510 around 2 mA input current that has a slope of about 0.4 Volts/mA. When an AC input signal is applied with a peak to peak amplitude of 0.5 mA, the AC output signal has a peak to peak output amplitude of 0.2 Volts.

The substantially linear region 510 may be formed as an average of the input-output response curves of multiple MLU's 102. In the example of FIG. 5, each MLU 102 switches over a different input current range. For example, MLU's 102 may switch over input currents in the range from about 1.5 mA to about 2.25 mA on the lower end 502, and in the range from about 1.75 mA to about 2.5 mA on the higher end 504 as shown in FIG. 5. To stay in the linear region of the IV response curve, the output voltage swing resulting from this input current swing may be up to about 80% of the full output voltage range. It is contemplated that these input current ranges may be varied across embodiments of the MLU 102 based on forming the sense layer 104, the storage layer 106, and/or the layer 108 from different choices of materials, material concentrations, and/or material thicknesses. For example, these input current ranges may typically vary from those shown in FIG. 5 to an input current range around a DC current of about 5 mA.

In one embodiment, an MLU circuit module 100 included in an analog circuit may be biased for small signal operation, such that an AC output of the MLU circuit module 100 varies substantially linearly with an AC input to the MLU circuit module 100. Alternatively or in addition, the MLU circuit module 100 may be biased to substantially maximize gain of the analog circuit. Alternatively, the MLU circuit module 100 may be biased for large signal operation, such that the AC output of the MLU circuit module 100 varies substantially non-linearly with the AC input to the MLU circuit module 100. For example, the MLU circuit module 100 may be biased in saturation or at cut-off.

For example, there are multiple ways to set up the MLU-based amplifier 200, such as linear, saturated, and class C. For linear amplification, such as for class A amplification, the input DC current can be adjusted to an operating point (bias point) where slope of the response curve is the highest (e.g., where a gain of the MLU-based amplifier 200 is substantially maximized). In the example of FIG. 5, this operating point is at about 2 mA input current. For maximum power efficiency, such as for class C amplification, the input DC current can be adjusted to an operating point where the DC power associated with the DC bias current 210 in the output stage of the MLU-based amplifier 200 is at its minimum, where the operating point remains within the substantially linear region 510. In the example of FIG. 5, this operating point is at about 2.25 mA input current. It is contemplated that averaging of the input-output response curves of many MLU's 102 (such as thousands of MLU's 102 in the example of FIG. 5) in an MLU-based amplifier 200 may result in increased linearity of the substantially linear region 510 of the MLU-based amplifier 200 as compared to the input-output response curve of a single MLU 102. It is also contemplated that averaging of the input-output response curves of many MLU's 102 in each MLU-based amplifier 200 may result in greater uniformity and predictability of the class A and class C operating points across the MLU-based amplifiers 200.

Referring to FIGS. 1 and 2, the output current per MLU 102 should be low enough to avoid heating the MLUs 102 close to the blocking temperature of the storage layer 106 (or in other embodiments, the reference layer). In the example of FIG. 5, the output current per MLU 102 is set at a conservative 20 µA to prevent the stored magnetizations from switching during amplification. A programming current (described further below) that sets the storage magnetization 146 (or in other embodiments, the reference magnetization) is anticipated to be approximately 0.2 mA per MLU 102, which is many times larger than the 20 µA setting during amplification. In the example of FIG. 5 (with Np=1000 parallel rows of MLU's 102, each row having Ns=10 MLU's 102 in series), the total DC output current to maintain 20 µA per MLU 102 is (Np×20 µA), or 20 mA. When the DC bias current 210 is configured to be a constant 20 mA applied through the output, the voltage drop is about 0.2 Volts when all of the MLU's 102 are substantially aligned, and swings to about 0.4 Volts when all of the MLU's 102 are substantially anti-aligned.

Referring to FIGS. 2 and 5, the output power delivered to a load by the MLU-based amplifier 200 depends on the operating point, and impedance matching between the output of the MLU-based amplifier 200 and the load. We now determine a relationship between the output power of the MLU-based amplifier 200 and the output power of an individual MLU 102. The output power of the MLU-based amplifier 200 is:

$$Pout=\Delta(Vout) \times Iout/2 \quad (1)$$

In this example, the MLU-based amplifier 200 has Np parallel rows of MLU's 102, each row having Ns MLU's 102 in series. The voltage drop across the MLU-based amplifier 200 is then:

$$\Delta Vout = Ns \times Rmtj \times I_s \quad (2)$$

where Rmtj is the resistance of each MLU 102 with both domains substantially aligned. In this example Rmtj has a value of approximately 1 kOhm. $I_s$ is the current circulating in each row of Ns MLUs 102 in series. Then the total current circulating through the MLU-based amplifier 200 is:

$$Iout = I_s \times Np \quad (3)$$

The maximum output power delivered by the MLU-based amplifier 200 is:

$$Pout = Ns \times Np \times Rmtj \times I_s^2/2 \quad (4)$$

The right side of this equation can be rewritten in terms of Pmtj, the output power delivered by a single MLU 102:

$$Pout = N \times Pmtj \quad (5)$$

where N is the total number of MLU's 102 in the MLU-based amplifier 200. This analysis indicates that the architecture of the MLU-based amplifier 200 may be highly scalable, as the higher the number of interconnected MLU's 102, the higher the output power of the MLU-based amplifier 200 may be. This analysis also indicates that the output power of the MLU-based amplifier may not be dependent on whether the MLU's 102 are connected in series or in parallel. For example, an MLU-based amplifier 102 including 50,000 MLU's 102 has a Pout of 10 mW for various possible example configurations:

Configuration 1: Np=2,500, Ns=20: ΔVout=0.4V Iout=50 mA Pout=10 mW

Configuration 2: Np=1,000, Ns=50: ΔVout=1.0V Iout=20 mA Pout=10 mW

Configuration 3: Np=500, Ns=100: ΔVout=2.0V Iout=10 mA Pout=10 mW

For configuration 3, if the AC signal at the input stage has a peak current of 0.25 mA and a voltage of 2 mV, the value of Pin, the power in, is 0.5 µW. The Pout in the linear range may be at least 5 mW, so the resulting gain in power may be 36.9 dB.

As can be seen from the above example, and referring to FIG. 2, the DC bias current 210 and the peak-to-peak voltage of the output signal 132 for a given maximum output power of the MLU-based amplifier 200 are dependent on the number of parallel rows of MLU's 102, and the number of MLU's 102 in series in each row. The DC bias current 210 and the peak-to-peak voltage of the output signal 132 for a given maximum output power of the MLU-based amplifier 200 are therefore dependent on the combined resistance of the MLU's 102 included in the MLU-based amplifier 200. This is also the case for the MLU circuit modules 100 included in any of the analog circuits described herein.

Referring to FIGS. 1 and 4, the storage layer 106 may be configured through a configuration operation. This configuration operation may occur during processing by the MLU circuit module 100. In one embodiment, during a programming cycle, a relatively small current is applied through the MLU 102 to heat the pinning layer 910 by Ohmic effect. When a temperature of the pinning layer 910 is above a blocking temperature, the direction of the storage magnetization 146 is unpinned, thereby allowing the storage magnetization 146 to be programmed by applying a current through the field line 112 that is magnetically connected to the cell. The storage magnetization 146 can be configured in a first direction by applying the current in one particular direction, and can be configured in a second direction opposite to the first direction by applying the current in an opposite direction. After programming, the MLU 102 is cooled below the threshold temperature, thereby pinning the storage magnetization 146 in the programmed direction. In another embodiment (in which the MLU 102 may include a reference layer instead of the storage layer 106), a magnetization of the reference layer may be pre-configured, such as in the factory.

Alternatively or in addition, in one embodiment, the storage magnetization 146 may be pre-configured, such as in the factory, by one or more of a magnetic field generated by a field line external to the MLU-based amplifier 200, a magnetic field generated by a field line internal to the analog circuit including the MLU circuit module 100 (such as the field line 112), and an external magnetic field. In one embodiment, the MLU circuit module 100 may be heated to a specific temperature (such as one of 160 degrees C., 180 degrees C., or 200 degrees C.) then cooled to room temperature in the presence of the magnetic field to configure the storage magnetization 146 of the MLU's 102 included in the MLU circuit module 100. The heating may be performed by external heating, such as elevating the ambient temperature. Alternatively or in addition, the heating may be by an internal heating mechanism, such as a field line and/or a bit line (described below). Internal heating may be used to differentially heat a subset of the MLU's 102 included in the MLU circuit module 100 so that only that subset of the MLU's 102 will be configured by a magnetic field applied at a given time. Alternatively or in addition, the heating may be performed by a combination of external heating and internal heating.

Still referring to FIGS. 1 and 4, the MLU circuit module 100 may also include a set of traces (or strip conductors) to provide programming functions. Specifically, a bit line 916 is electrically connected to the MLU 102 on the side of the sense layer 104 (or, in an alternative embodiment, the reference layer) and is substantially orthogonal to the field line 112, which is disposed below and magnetically connected to the MLU 102 on the side of the storage layer 106. The bit line 916 may include at least part of the output line 116 of FIG. 1, or may correspond to the output line 116 of FIG. 1. The MLU circuit module 100 may further include a transistor 918, which is electrically connected, through the strap 120, to the MLU 102 on the side of the storage layer 106. The transistor 918 is switchable between a blocked mode (OFF) and a conducting mode (ON), thereby allowing the flow of a current through the MLU 102. Other implementations of the MLU circuit module 100 are contemplated. For example, the relative orientation of the bit line 916 and the field line 112 can be varied from that illustrated in FIG. 4. As another example, the relative positioning of the bit line 916 and the field line 112 can be reversed, with the field line 112 disposed above the bit line 916.

Referring to FIG. 4, during a TAS-type programming cycle, the MLU 102 is heated by applying a heating current through the MLU 102 via the bit line 916, with the transistor 918 in a conducting mode. As described previously, during pre-configuration in the factory, this internal heating mechanism may be used. Alternatively or in addition, external heating may be used. The MLU 102 is heated to a temperature above the blocking or threshold temperature $T_{BS}$ of the pinning layer 910, such that a magnetization of the storage layer 106 is unpinned. (In the alternative embodiment in which the MLU 102 includes a reference layer instead of the sense layer 104, the MLU 102 is heated to a temperature above the blocking or threshold temperature $T_{BS}$ of the pinning layer 910 but below the blocking or threshold temperature $T_{BR}$ of the additional pinning layer, such that a magnetization of the storage layer 106 is unpinned but the magnetization of the reference layer remains fixed.) Simultaneously or after a short time delay, the field line 112 is activated to induce a write magnetic field to switch the storage magnetization from an initial direction to another direction. Specifically, a write current is applied through the field line 112 to induce the write magnetic field to switch the storage magnetization direction, according to the direction of the write current. As described previously, during pre-configuration in the factory, this internal magnetic field may be used. Alternatively or in addition, an external magnetic field may be used. Because the storage magnetization direction can be aligned according to the write magnetic field (and/or external magnetic field), the storage magnetization direction can be switched between multiple directions according to a programming encoding scheme. One possible encoding scheme is implemented with a pair of directions that are displaced by about 180°, such that a "0" is assigned to one of the pair of directions, and a "1" is assigned to another one of the pair of directions.

Once the storage magnetization is switched to a programmed direction, the transistor 918 is switched to a blocked mode to inhibit current flow through the MLU 102, thereby cooling the MLU 102. The write magnetic field can be maintained during cooling of the MLU 102, and can be deactivated once the MLU 102 has cooled below the blocking temperature $T_{BS}$ of the pinning layer 910. Because the storage magnetization direction is pinned by the exchange bias of the pinning layer 910, its orientation remains stable so as to retain the stored magnetization direction.

Other implementations of programming cycles are contemplated. For example, the MLU 102 can be implemented with an anisotropic shape having a relatively high aspect ratio, such as about 1.5 or more. In such an anisotropic-shaped implementation of the MLU 102, the storage magnetization direction can be switched and can remain stable, without requiring the pinning layer 910. As another example, a programming cycle can be carried out by applying a write current through the MLU 102 via the bit line 916, using the so-called spin transfer torque ("STT") effect. In such a STT-type programming cycle, the write current can become spin polarized by passing through a polarizing magnetic layer (not illustrated) or through the sense layer 104, and a magnetization of the storage layer 106 can be switched according to a spin-polarized orientation of the write current. Switching of the storage layer magnetization with the spin-polarized write current also can be combined with a TAS-type programming cycle, such as by heating the MLU 102 above the blocking temperature $T_{BS}$ and then applying the spin-polarized write current through the MLU 102.

Figure 6:
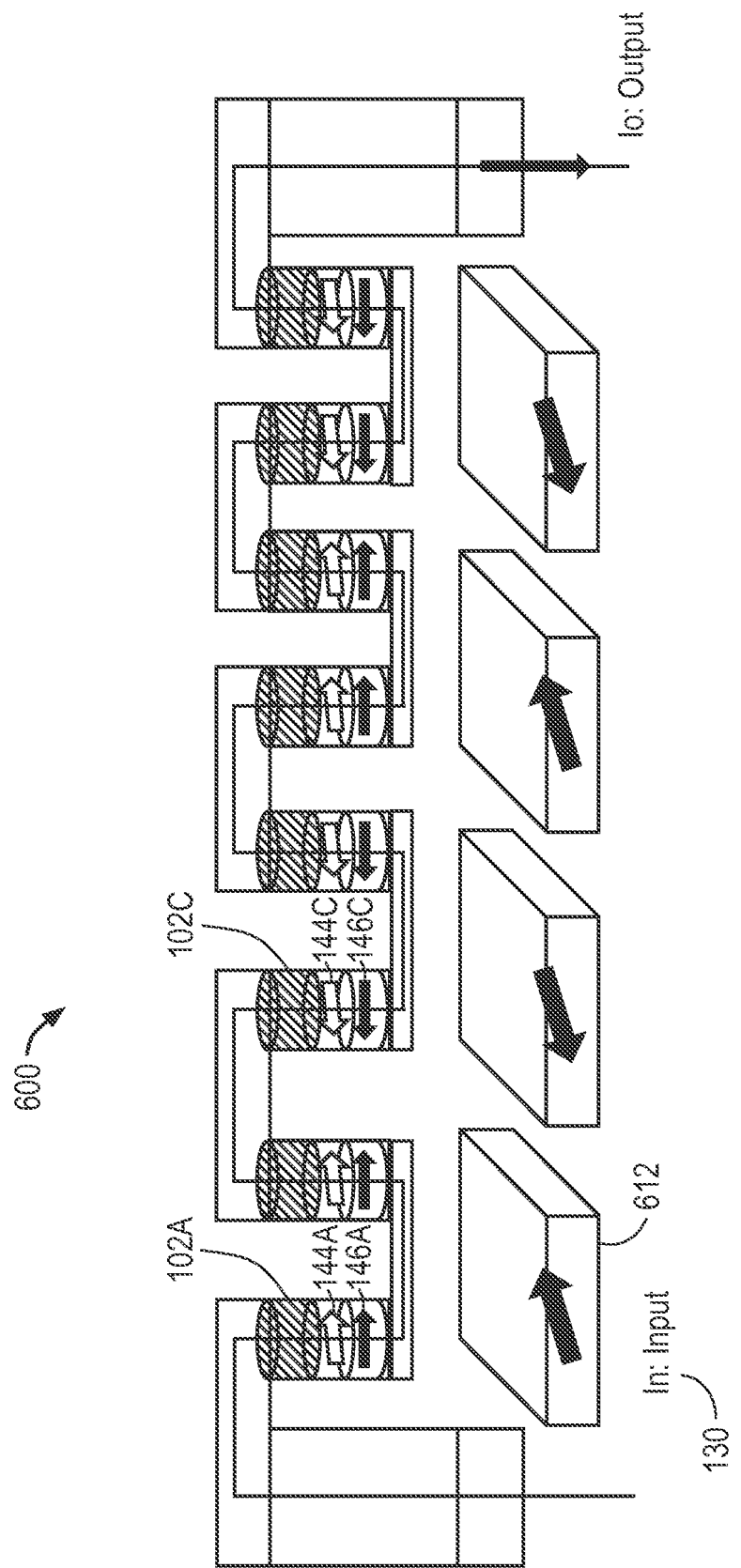
FIG. 6 illustrates a perspective view of an MLU circuit module 600, according to an embodiment of the invention.

FIG. 6 illustrates a perspective view of an MLU circuit module 600, according to an embodiment of the invention. The MLU circuit module 600 is in many respects similar to the MLU circuit module 100 already described with reference to FIG. 1. As described with reference to FIGS. 5 and 7, the MLU's 102 included in the MLU circuit module 600 may be arranged in an array with Np parallel rows of MLU's 102, each row having Ns MLU's 102 in series. This array may be compact. For example, 50,000 MLU's 102 may fit in a footprint with an area in the range from about 0.1 to about 0.5 square millimeters.

In one embodiment, the array of MLU's 102 included in the MLU circuit module 600 may be magnetically connected to a single field line 612. The field line 612 may be curved and/or serpentine (shown in FIG. 7). In this embodiment, the input current 130 flowing through the field line 612 flows in a first direction relative to the MLU 102A and in a second direction substantially opposite to the first direction relative to the MLU 102C. As a result, a direction (shown in FIG. 6) of the sense magnetization 144A and the storage magnetization 146A of the MLU 102A resulting from the input current 130 is substantially opposite to a direction (shown in FIG. 6) of the sense magnetization 144C and the storage magnetization 146C of the MLU 102C resulting from the input current 130.

For self-referenced MLU's 102, the configuration of the storage magnetization 146 of each of the MLU's 102 by the field line 612 allows the direction of the input current 130 flowing through the field line 612 to switch from a first direction to a second direction substantially opposite to the first direction. For example, prior to operating the MLU circuit module 600 with the input current 130 flowing in the first direction, the storage magnetizations 146 of the MLU's 102 may be configured with the input current 130 flowing in the first direction (described with reference to FIG. 4), and therefore based on the shape of the field line 612. Prior to operating the MLU circuit module 600 with the input current 130 switched to the second direction, the storage magnetizations 146 of the MLU's 102 may be configured with the input current 130 flowing in the second direction (described with reference to FIG. 4), and again based on the shape of the field line 612. In this way, in one embodiment, both directions of input current flow through a serpentine field line may be leveraged.

Alternatively, for MLU's 102 in which a reference magnetization is pre-configured (such as in the factory), the pre-configuration may be performed such that the direction of the reference magnetization corresponds to the first direction of input current flow through the field line 612, and is therefore based on the shape of the field line 612. In this embodiment, because the direction of the reference magnetization is not subsequently changed, the MLU circuit module operates with the input current 130 flowing in the first direction, but not with the input current 130 flowing in the second direction.

Figure 7:
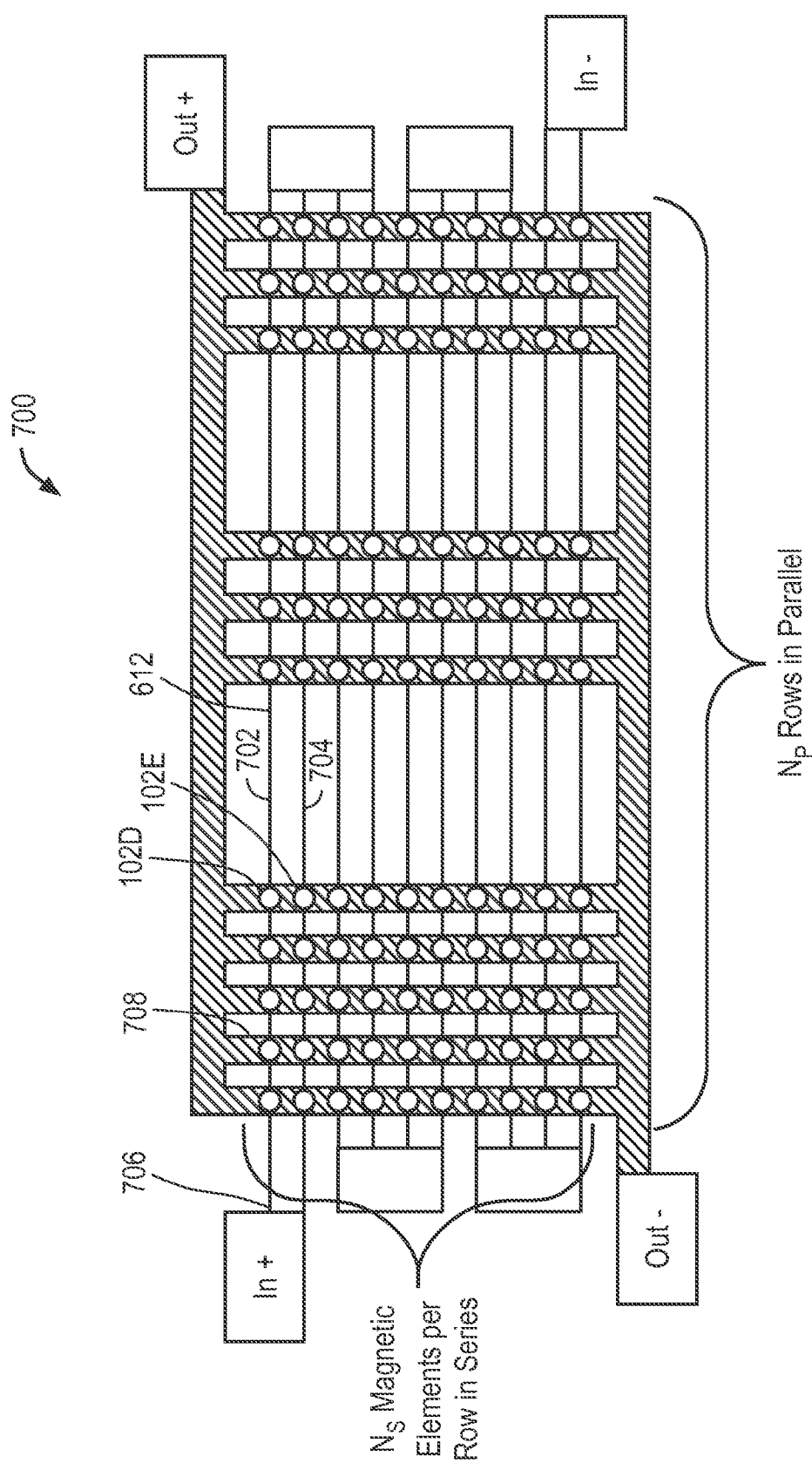
FIG. 7 illustrates an array with large numbers of MLU's 102 configured in accordance with an embodiment of the invention.

FIG. 7 illustrates a perspective view of an MLU circuit module 700, according to an embodiment of the invention. The MLU circuit module 700 is in many respects similar to the MLU circuit module 600 already described with reference to FIG. 6, so differences are discussed here. In this embodiment, the field line 612 has a first lateral edge 702, a second lateral edge 704 opposite to the first lateral edge 702, and a first end 706. The MLU's 102 are divided into groups, where at least a portion of each of the MLU's 102 in each group is disposed between the first lateral edge 702 and the second lateral edge 704, and where each of the MLU's 102 in each group is disposed substantially the same distance (lengthwise along the field line 612) from the first end 706. In the embodiment of FIG. 7, there are two MLU's 102 in each group. For example, MLU's 102D and 102E are in one group. It is contemplated that in other embodiments, there may be more or fewer MLU's 102 in each group. For example, there may be one, three, four, or five MLU's in each group.

It may be advantageous to widen the field line 612 to accommodate the number of MLU's 102 in each group. A wider field line 612 has a lower resistance, which can reduce the input power per MLU 102. In addition, a larger number of MLU's 102 per group can also reduce the input power per MLU 102. However, it should be noted that effectiveness of cladding adjacent to the field line 612 (for focusing the magnetic field generated by the field line 612 so that magnetic coupling to the MLU's 102 is increased) may be reduced for a wider field line 612.

Figure 8:
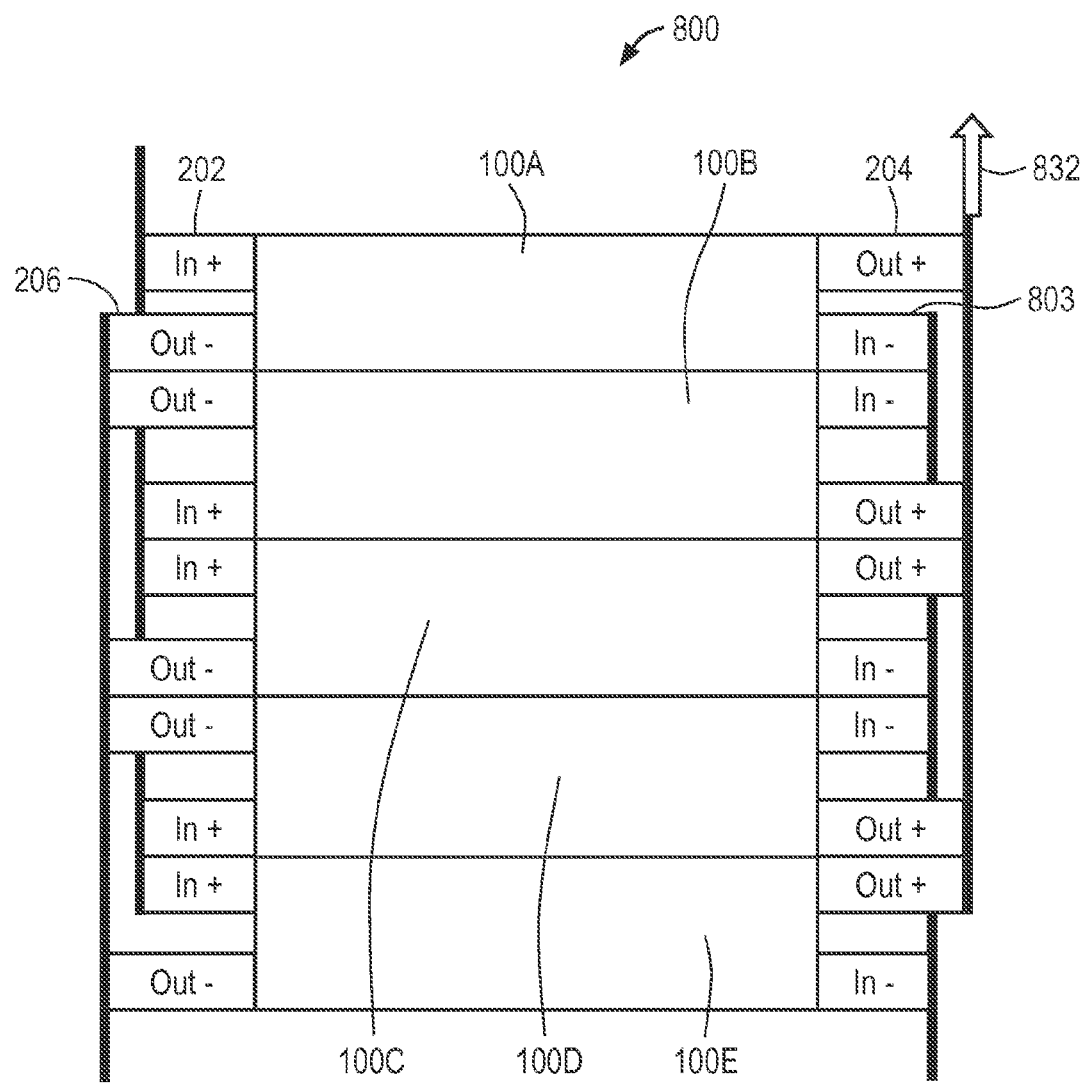
FIG. 8 illustrates a perspective view of multiple MLU circuit modules 100 connected together in a larger array 800, according to an embodiment of the invention.

FIG. 8 illustrates a perspective view of multiple MLU circuit modules 100 connected together in a larger array 800, according to an embodiment of the invention. The MLU circuit modules 100 (100A-100E in this embodiment) may be disposed laterally adjacent to each other, with input ports 202 connected together, input ports 803 connected together, output ports 204 connected together, and output ports 206 connected together. In this way an output signal 832 with increased output power can be generated, as compared to the output signal 132 (see FIG. 2) of a single MLU circuit module 100. It is contemplated that other embodiments of MLU circuit modules, such as MLU circuit modules 600 and 700, may also be connected together in this manner to obtain an output signal with increased output power.

Figure 9:
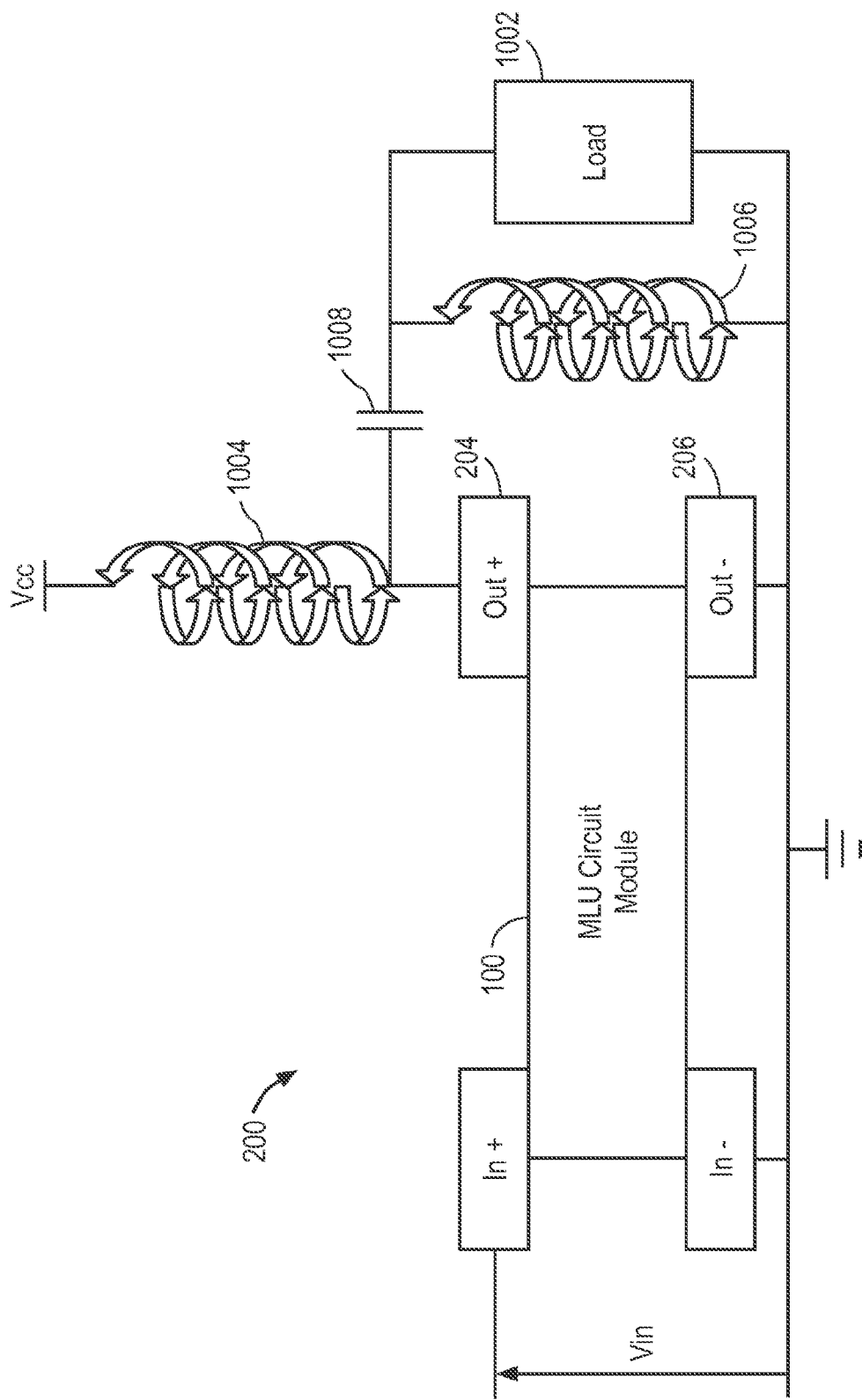
FIG. 9 illustrates a logical block diagram of an MLU-based amplifier 200 that is impedance matched to an output load 1002 according to an embodiment of the invention.

FIG. 9 illustrates a logical block diagram of an MLU-based amplifier 200 that is impedance matched to an output load 1002, according to an embodiment of the invention. The output resistance of the MLU circuit module 100 (across the output terminals 204 and 206) may be set to facilitate impedance matching to the load 1002. Referring to FIG. 7, for example, Ns (the number of MLU's 102 per output row 708 in series) and Np (the number of rows 708 of MLU's 102 in parallel) can be pre-configured (such as during fabrication) for a given total number (Ns×Np) of MLU's 102 to set the output resistance of the MLU circuit module 100. In addition, inductances 1004 and 1006 and capacitance 1008 can be determined and/or set for impedance matching to the load 1002. For example, these components can be pre-configured during fabrication.

In addition, the input resistance of the MLU circuit module 100 may be set to facilitate input impedance matching. For example, a width of the field line 112 (see FIG. 1) may be pre-configured (such as during fabrication) to set the input resistance of the MLU circuit module 100. One of ordinary skill in the art would understand how to determine the input resistance of the MLU circuit module 100 and any inductances and capacitances needed for input impedance matching. One of ordinary skill in the art would also understand how to pre-configure these components (such as during fabrication).

Figure 10:
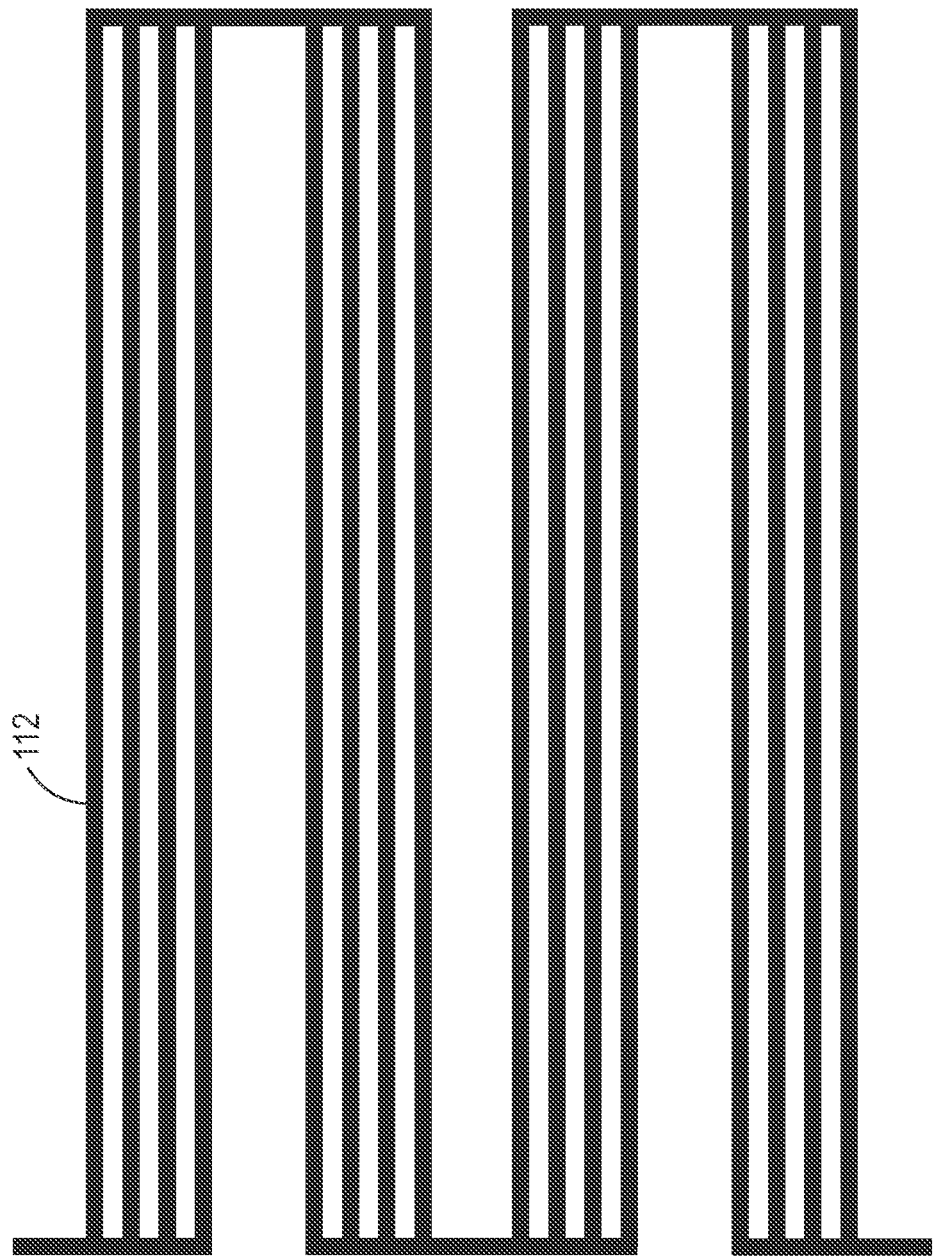
FIG. 10 illustrates multiple field lines 112 in parallel, according to an embodiment of the invention.

FIG. 10 illustrates multiple field lines 112 in parallel, according to an embodiment of the invention. Each of the multiple field lines 112 has an impedance that may include a resistive component (corresponding to a resistance) and a reactive component (corresponding to an inductance and/or a capacitance). It may be advantageous to provide multiple field lines 112 in parallel to reduce the input resistance of the MLU circuit module 100. Multiple field lines 112 in parallel have a lower resistance, which can reduce the input power dissipation per MLU 102. Multiple field lines 112 in parallel may also increase the effectiveness of cladding adjacent to the field line 612 (for focusing the magnetic field generated by the field line 612 so that magnetic coupling to the MLU's 102 is increased) as compared to the wider field line 612 described with reference to FIG. 7.

In one embodiment, and with reference to FIGS. 1, 2, and 3, the switching of the storage magnetization 146 and the sense magnetization 144 may be faster than electron transfer mechanisms, which can result in an extended cutoff frequency for the MLU amplifier 200. The switching may occur in the range from about 1 picosecond to about 20 picoseconds, such as about 10 picoseconds. With such a range of values, the MLU amplifier 200 may be capable of operating in the 100 GHz range, and potentially in the 1 THz range. Unlike traditional semiconductor devices, the Miller effect (or increase in parasitic capacitance resulting from a gain amplified feedback loop of the output to the input) is reduced. Between the field line 112 and the strap 120 under the MLU 102, there is a parasitic capacitance that shunts the device at extremely high frequency. In embodiments of the invention, this capacitance may be reduced by:

Reducing the size of the MLU's 102 and the strap 120 connecting two adjacent MLU's 102;

Using low dielectric constant (K) material for the dielectric located between the MLU's 102 and the field line 112; and Using separated field lines 112 to reduce overlap area between the strap 120 and the field lines 112.

In one example, the parasitic capacitance per MLU 102 is $$C = k\, e_0 A/d \qquad (6)$$

with K=3.9; vacuum permittivity $e_0$=8.86×10$^{-14}$ F/cm; area A=200 nm×100 nm; and distance d=50 nm. The total capacitance of multiple MLU's 102 is C multiplied by the total number of MLU's 102, and the cutoff frequency is 1/RC. This yields a maximum cutoff frequency of 400 GHz for a 10 mW 2,500×20 (Np=2,500, Ns=20) device operating with a swing voltage of 0.4 Volts; or 25 GHz for a 1,000×50 (Np=1,000, Ns=50) operating at 1 Volt. Separating the field line 112 into two field lines 112 in parallel and using a dielectric with K=2.5 may enhance the maximum cutoff frequency to about 1 THz. Other parasitic capacitances do exist so the actual cutoff frequency may be somewhat lower. However, these cutoff frequency values are larger than those of existing technologies.

In one example, and referring to FIGS. 1 and 2, the power added efficiency of the MLU circuit module 100 is Peff=(AC Pout)/DC Power. The DC power to operate the MLU device in a class C mode may be the multiplication of the bias voltage Vcc (see FIG. 9) by the DC current circulating through the output of the MLU circuit module 100 when all magnetic domains of the MLU's 102 are aligned (minimum resistivity). In one example, the maximum resistance of each MLU 102 (at a first phase of the AC signal) is approximately double the minimum resistance of each MLU 102 (at a second, opposite phase of the AC signal). This suggests that the power added efficiency may be about 50%. It may be advantageous to increase the power added efficiency above this value, such as by increasing the ratio between the resistance of the MLU 102 when the storage magnetization 146 and the sense magnetization 144 are aligned (e.g., substantially parallel) and the resistance of the MLU 102 when the storage magnetization 146 and the sense magnetization 144 are anti-aligned (e.g., substantially anti-parallel). It is contemplated that these resistance values, and in particular the ratio between these resistance values, may be varied for other embodiments of the MLU 102 based on forming the sense layer 104, the storage layer 106, and/or the layer 108 from different choices of materials, material concentrations, and/or material thicknesses. For example, a ratio of 75%-90% could significantly increase the power added efficiency.

The performance of the MLU's 102 can be characterized in terms of tunnel magnetoresistance (TMR). TMR can be expressed as:

$$TMR = ((R\text{anti-parallel}) - (R\text{parallel}))/(R\text{parallel}) \qquad (7)$$

For an Rparallel of 1 kOhm and an Ranti-parallel of 2 kOhm, the TMR is 100%, which may yield a power added efficiency that is below 50% class C. A TMR of 200% may yield a higher power added efficiency of 66%, and a TMR of 1000% may yield 90%. These higher TMR values may allow the MLU-based amplifier 200 to operate with a lower static DC bias current, minimizing power losses. Increasing TMR may also increase linearity.

Referring to FIG. 7, to efficiently extract heat to maintain the temperature of the MLU's 102 below the blocking temperature (such as below 150° C.) during amplification, the MLU's 102 may be spread out across a larger area, such as by increasing the separation of the MLU's 102 in each row and by increasing the spacing between the rows. On the other hand, to heat the MLU's 102 above the blocking temperature during configuration of the storage magnetizations 146, one or more of the following approaches may be used:

Increase the voltage 10 times above the normal operating voltage of the MLU's 102 during the heating cycle;

Increase the duration of the heating cycle;

Increase the external temperature of the die during factory programming by placing it in an heating device like an hot chuck, hot gas blower, lamp, etc.;

Place extra pins in the device that allow localized heating of pieces of the array of MLU's 102; and Use large external magnetic fields.

Referring to FIGS. 6, 7, and 10, the input field line 612 has a linear resistance Rin, a parasitic capacitance Cin, and a parasitic inductance Lin. Reduction of these losses can be achieved by one or more of the following:

Reduce the resistivity of the copper line forming the field line 612;

Increase the spacing between segments of the field line 612, if curving or serpentine, and/or between multiple field lines 612;

Use low k material as a dielectric between the segments of the field line 612 and/or between multiple field lines 612; and Insert a dummy absorbing layer between the segments of the field line 612 and/or between multiple field lines 612.

With regard to manufacturing and layout considerations, and referring to FIGS. 1, 2, and 4, analog circuits including MLU circuit modules 100 such as the MLU-based amplifier 200 can be manufactured directly on substrates without CMOS with a total of 5-6 masking layers. In one embodiment, the process flow may include the following steps:

1> Planar dielectric deposition
  Selective dry etch of the dielectric to form metal 1 interconnect (Mask 1)
  Blanket cladding layer deposition
  Blanket Cu deposition
  CMP to finalize metal 1 (such as field line 112 and metal portions electrically connected to output line 116)
2> Planar dielectric deposition
  Strap metal deposition (such as strap 120)
  Selective etch of the strap (Mask 2)
3> Magnetic stack deposition (such as at least magnetic layers included in MLU's 102) (may include finishing by Tantalum)
  Selective etch of the magnetic stack (Mask 3)
  Dielectric filling
  CMP to expose the magnetic stack and/or Tantalum finishing layer
4> Selective etch of vias connecting portions of metal 1 and metal 2 (mask 4)
5> Planar deposition of metal 2 (such as output line 116)
  Selective etch of metal 2 (Mask 5)
6> Planar deposition of passivation (optional)
  Selective etch of passivation (optional mask 6)

Referring to FIGS. 1 and 7, in one embodiment, the array of MLU's 102 includes a combination of two perpendicular comb-shaped metal layers. The first metal layer includes the input field line 112, and the second metal layer includes the output rows 708.

Referring to FIGS. 1 and 2, in one embodiment the MLU-based amplifier 200 may be a low-loss switch. For example, the stored magnetizations 146 may be configured in the opposite direction from input current flow in the field line 112 during switching operation to get substantially zero AC output, or may be configured in the same direction as input current flow in the field line 112 to get substantially full AC output. The programming cycle can be performed by applying a current high enough to heat MLU's 102 included in the MLU-based amplifier 200 above the blocking temperature, and a current to configure the storage magnetizations 146 in one direction or the opposite relative to the input current flowing through the field line 112 to get a pass or a no-pass. Such a programming cycle can be below 1 ms. In one embodiment, the programming cycle can be performed prior to passing the input signal 130 through the field line 112. Alternatively or in addition, the programming cycle can be performed concurrently with passing the input signal 130 through the field line 112. In this way, the combined resistance of the of the MLU's 102 included in the MLU circuit module 100 can be configured to provide an output signal with two levels. For example, referring to FIGS. 1, 2, and 5, when the DC bias current 210 is configured to be a constant 10 mA applied through the output, the voltage drop is about 2.0 Volts (substantially full AC output) when all of the MLU's 102 are substantially aligned, and swings to about 4.0 Volts (substantially zero AC output) when all of the MLU's 102 are substantially anti-aligned.

Referring to FIGS. 1, 2, and 5, and in one embodiment, the MLU's 102 may experience hysteresis. In particular, the magnitude of the input current 130 that aligns the storage magnetization 146 and the sense magnetization 144 to be substantially parallel as the input current 130 is increasing may be greater than the magnitude of the input current 130 that flips the storage magnetization 146 and the sense magnetization 144 back to be substantially anti-parallel as the input current 130 is decreasing. For example, if the mid-point input current 130 is 2 mA, it may take 2.1 mA to align the magnetizations to be substantially parallel as the input current 130 increases, and 1.9 mA to flip the magnetizations to be substantially anti-parallel as the input current decreases. For this degree of hysteresis, the MLU-based amplifier 200 may operate with a peak current of 0.2 mA.

In one embodiment, multiple MLU-based amplifiers 200 with different bias points may be connected in parallel so that hysteric effects in the combined output of the multiple MLU-based amplifiers 200 can be reduced, such as tuned to approximately zero.

FIGS. 11-25, discussed below, illustrate examples of various types of MLU-based analog circuits, including amplifiers, current sources, oscillators, mixers, and motor drivers. The use of the MLU circuit module 100 instead of conventional active devices such as transistors in these MLU-based analog circuits has various benefits. One benefit is that these MLU-based analog circuits can be fabricated with back end of line (BEOL) only integration, as complementary metal oxide semiconductor (CMOS) fabrication processing need not be performed. Because CMOS is not needed, fewer masking layers are needed and the fabrication process can be simplified, resulting in lower cost. Alternatively or in addition, the fabrication process for MLU-based analog circuits such as high-bandwidth amplifiers can be integrated with standard (e.g., low frequency) CMOS logic processes in a straightforward manner.

Another benefit is that these MLU-based analog circuits can achieve high performance and can be flexibly configured. For example, high bandwidth can be achieved in these MLU-based analog circuits without the need for specialty transistors (e.g., GaAs). Also, high linearity (where needed) and large common mode range can be achieved in these MLU-based analog circuits. Linearity is dependent on factors such as TMR of the MLU's 102 and common mode range is adjustable based on TMR of the MLU's 102. In addition, referring to FIG. 7, the gain of MLU-based analog amplifiers is configurable based on Ns (the number of MLU's 102 per row in series) and Np (the number of rows of MLU's 102 in parallel). Also, these MLU-based analog circuits can be configured to provide a large output signal based on Ns and Np, so pre-amplification may not be needed prior to these MLU-based analog circuits. Further, unlike Hall sensors, digital sampling may also not be needed prior to these MLU-based analog circuits, which can reduce jitter in the output of these MLU-based analog circuits.

A further benefit is that these MLU-based analog circuits can be robust and resistant to various effects that can damage conventional active devices such as transistors. MLU-based analog circuits may have enhanced mean time between failures (MTBF) because unlike CMOS-based transistors, MLU's 102 are not susceptible to transistor related effects such as charge trapping and breakdown voltages. One reason for this is because MLU's 102 do not have junctions typical of transistors, such as p-n, source-to-body, and drain-to-body junctions. Also, because the response of these MLU-based analog circuits is an averaged response of the outputs of potentially thousands or more MLU's 102, failures of a few of these MLU's 102 do not necessarily have any meaningful effect on the response of these MLU-based analog circuits.

In addition, MLU's 102 can show resistance to electrostatic discharge (ESD) effects because MLU's 102 do not have these junctions typical of transistors. Further, MLU's 102 can be insensitive to damage from external magnetic fields because of pinning of the storage layer 106 (see FIGS. 1 and 4).

Another benefit is that the MLU's 102 in these MLU-based analog circuits, because they are N-terminal devices with N greater than or equal to 4, can be daisy-chained such as, for example, in FIGS. 16-22 and 25. In this way, field lines in these MLU-based analog circuits can traverse multiple MLU's 102, reducing the number of field lines needed. Also, the same bias current can be supplied to multiple MLU's 102 to reduce or eliminate common mode effects.

Figure 11:
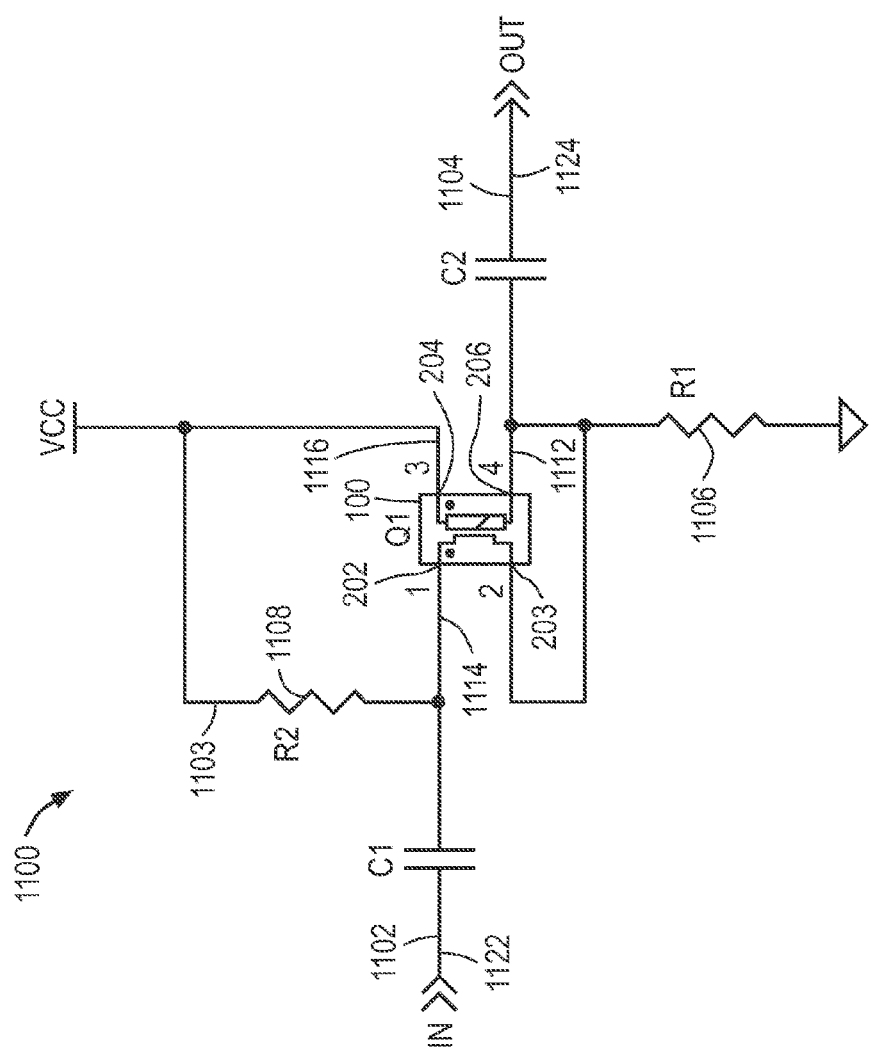
FIG. 11 illustrates an MLU-based follower amplifier 1100, according to an embodiment of the invention.

FIG. 11 illustrates an MLU-based follower amplifier 1100, according to an embodiment of the invention. The MLU-based follower amplifier 1100 includes the MLU circuit module 100 and resistors 1106 and 1108. An input current 1114 to the MLU circuit module 100 is generated based on AC input current 1102 and field bias current 1103. A bias current 1116 is provided to the MLU circuit module 100 to set the output voltage and current of the MLU-based follower amplifier 1100. The bias current 1116 is also the output tunnel junction current 1116 flowing between the output terminal 204 and the output terminal 206 of the MLU circuit module 100.

Referring to FIGS. 1, 2B, and 11, the MLU-based follower amplifier 1100 may have unity voltage gain and be non-inverting, such that input voltage 1122 is approximately equal to output voltage 1124. The MLU-based follower amplifier 1100 may have a high input impedance and low output impedance. Also, the MLU-based follower amplifier 1100 may be DC stable. The common resistor 1106 may be sized such that it has approximately the same resistance as the combined resistance of the MLU circuit module 100 at or near the point of field line bias, such as approximately (½)×(Rmax+Rmin), where Rmax is the maximum combined resistance of the MLU circuit module 100, and where Rmin is the minimum combined resistance of the MLU circuit module 100. If a resistance of the resistor 1108 is configured to be equal to the resistance of the common resistor 1106, then a voltage 1112 at the output terminal 206 of the MLU circuit module 100 stabilizes at approximately one-half of the bias voltage (Vcc/2). The resistor 1106 provides negative feedback, as the resistor 1106 is common to both the input field line current 1114 flowing between the input terminal 202 and the input terminal 203 of the MLU circuit module 100, and the output tunnel junction current 1116 flowing between the output terminal 204 and the output terminal 206 of the MLU circuit module 100. This negative feedback helps to stabilize the operating point (bias point) of the MLU circuit module 100, and increases the input impedance of the MLU-based follower amplifier 1100. As the combined resistance of the MLU circuit module 100 varies over time, temperature, input voltage and/or current to the MLU circuit module 100, etc., the input field line current 1114 varies so as to maintain the output voltage 1104 as approximately constant.

In one embodiment, the MLU circuit module 100 is sized to provide effective current gain. The gain is dependent on factors such as TMR of the MLU's 102, configuration of the MLU circuit module 100, and slope of the input-output transfer characteristic (see FIG. 5) relating the output signal 132 of the MLU-based amplifier 200 to the input signal 130. Referring also to FIG. 7, configuration parameters of the MLU circuit module 100 on which the gain is dependent include Ns (the number of MLU's 102 per row in series) and Np (the number of rows of MLU's 102 in parallel). Tunnel magnetoresistance of the MLU circuit module 100 may appear as output leakage resistance, which can lower the current gain. The input DC bias current 1103, the input and output resistances of the MLU-based follower amplifier 1100 (for matching), and the output DC bias current 1116 may be adjusted based on Np×Ns. The output DC bias current 1116 may limit the available AC output current of the MLU-based follower amplifier 1100 by up to 50% of the value of the output DC bias current 1116. The gain may be adjusted based on Np×Ns (related to sensitivity of the MLU-based follower amplifier 1100), TMR of the MLU's 102, and slope of the input-output transfer characteristic (see FIG. 5 for an example of such a characteristic) of the MLU-based follower amplifier 1100.

Referring to FIGS. 1 and 11, the operating point of the MLU-based follower amplifier 1100 is dependent on the field line DC bias current 1103 which may be configured to be approximately at the statistical switch point. At the statistical switch point, for example, approximately 50% of the MLU's 102 have substantially parallel storage magnetization 146 and sense magnetization 144, and approximately 50% of the MLU's 102 have substantially anti-parallel storage magnetization 146 and sense magnetization 144.

Figure 12:
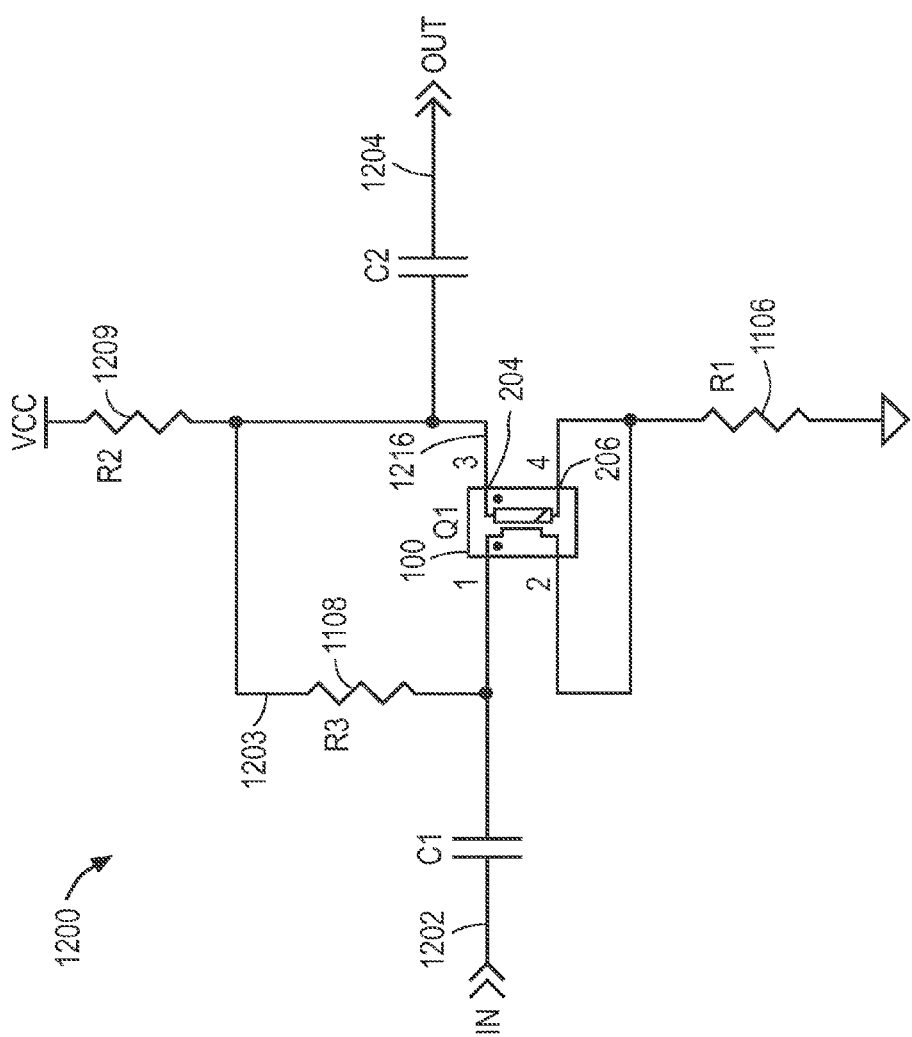
FIG. 12 illustrates MLU-based inverting amplifier 1200, according to an embodiment of the invention.

FIG. 12 illustrates MLU-based inverting amplifier 1200, according to an embodiment of the invention. The MLU-based inverting amplifier 1200 is similar to the MLU-based follower amplifier 1100 except for the addition of resistor 1209 and the connection of output 1204 to the output terminal 204 of the MLU circuit module 100 instead of the output terminal 206 of the MLU circuit module 100. The resistors 1106 and 1108 provide negative feedback and maintain DC stability.

The MLU-based inverting amplifier 1200 may have non-unity voltage gain and current gain. The MLU-based inverting amplifier 1200 may have a high input impedance and low output impedance. Also, the MLU-based inverting amplifier 1200 may be DC stable. In one embodiment, for an MLU circuit module 100 with high current gain, the voltage gain of the MLU-based inverting amplifier 1200 ((Vout at the output terminal 1204)/(Vin at input terminal 1202)) approaches (Resistance of resistor 1209)/(Resistance of resistor 1106). Tunnel magnetoresistance of the MLU circuit module 100 may appear as output leakage resistance, which can lower the current gain. The input DC bias current 1203, the input and output resistances of the MLU-based inverting amplifier 1200 (for matching), and the output DC bias current 1216 may be adjusted based on Np×Ns (see FIG. 7) of the MLU circuit module 100. The output DC bias current 1216 may limit the available AC output current of the MLU-based inverting amplifier 1200 by up to 50% of the value of the output DC bias current 1216. The gain may be adjusted based on Np×Ns (related to sensitivity of the MLU-based inverting amplifier 1200), TMR of the MLU's 102, and slope of the input-output transfer characteristic (see FIG. 5 for an example of such a characteristic) of the MLU-based inverting amplifier 1200.

Referring to FIGS. 1 and 12, the operating point of the MLU-based inverting amplifier 1200 is dependent on the field line DC bias current 1203 which may be configured to be approximately at the statistical switch point. At the statistical switch point, for example, approximately 50% of the MLU's 102 have substantially parallel storage magnetization 146 and sense magnetization 144, and approximately 50% of the MLU's 102 have substantially anti-parallel storage magnetization 146 and sense magnetization 144.

Figure 13A:
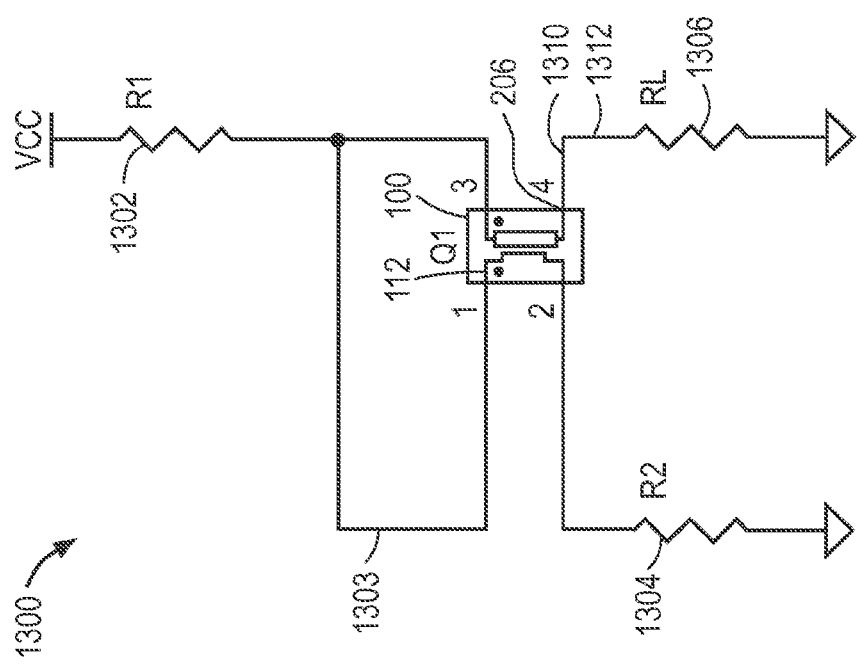
FIG. 13A illustrates an MLU-based current source 1300, according to an embodiment of the invention.

FIG. 13A illustrates an MLU-based current source 1300, according to an embodiment of the invention. In one embodiment, the MLU-based current source 1300 includes the MLU circuit module 100, resistors 1302 and 1304, and load resistor 1306. Output current 1310 at the output terminal 206 of the MLU circuit module 100 is a function of bias voltage Vcc and resistance of the resistor 1304. As resistance of the load resistor 1306 changes, current through the resistor 1302 changes in a corresponding manner. For example, an increase in resistance of the load resistor 1306 reduces voltage drop across the resistor 1302, causing more current to flow into the field line 112. In response, the combined resistance of the MLU circuit module 100 decreases. For a range of resistances of the load resistor 1306, the output current 1310 at the output terminal 206 of the MLU circuit module 100 approaches a constant current. The resistance of the load resistor 1306 can be chosen depending on the DC bias point desired (voltage at node 1312). In this embodiment, the load resistor 1306 is ground-referenced. The output current 1310 can be adjusted based on Np×Ns (see FIG. 7) of the MLU circuit module 100.

Referring to FIGS. 1 and 13A, the operating point of the MLU-based current source 1300 is dependent on field line DC bias current 1303 which may be configured to be approximately at the statistical switch point. At the statistical switch point, for example, approximately 50% of the MLU's 102 have substantially parallel storage magnetization 146 and sense magnetization 144, and approximately 50% of the MLU's 102 have substantially anti-parallel storage magnetization 146 and sense magnetization 144.

Figure 13B:
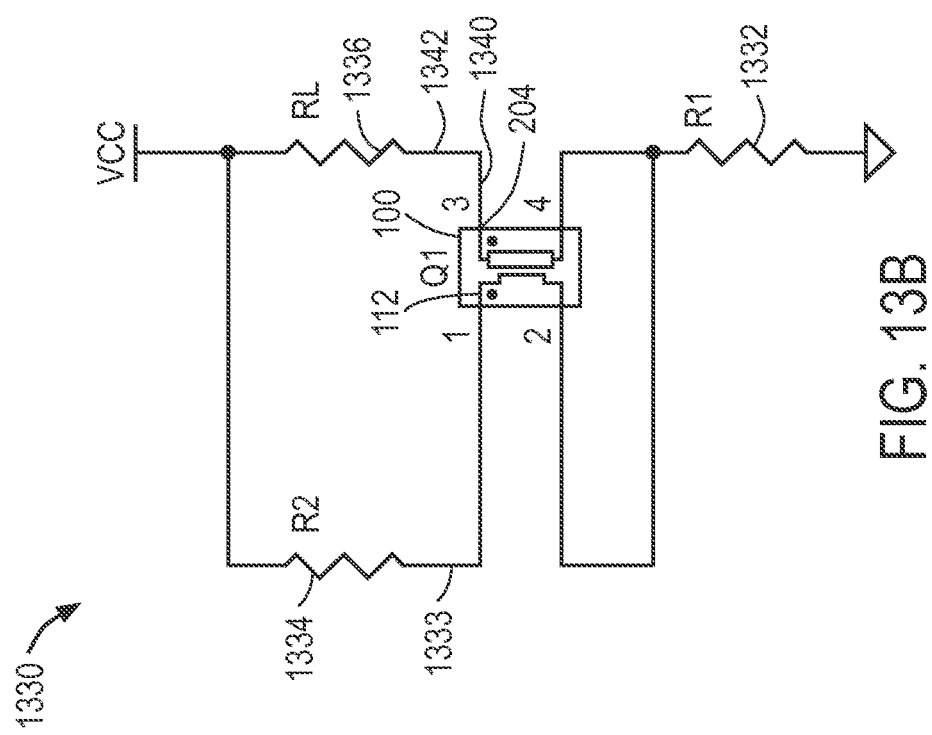
FIG. 13B illustrates an MLU-based current source 1330, according to an embodiment of the invention.

FIG. 13B illustrates an MLU-based current source 1330, according to an embodiment of the invention. In one embodiment, the MLU-based current source 1330 includes MLU circuit module 100, resistors 1332 and 1334, and load resistor 1336. Output current 1340 at the output terminal 204 of the MLU circuit module 100 is a function of bias voltage Vcc and resistance of the resistor 1334. As resistance of the load resistor 1336 changes, current through the resistor 1332 changes in a corresponding manner. For example, an increase in resistance of the load resistor 1336 reduces voltage drop across the resistor 1332, causing more current to flow into the field line 112. In response, the combined resistance of the MLU circuit module 100 decreases. For a range of resistances of the load resistor 1336, the output current 1340 at the output terminal 204 of the MLU circuit module 100 approaches a constant current. The resistance of the load resistor 1336 can be chosen depending on the DC bias point desired (voltage at node 1342). In this embodiment, the load resistor 1336 is supply-referenced. The output current 1340 can be adjusted based on Np×Ns (see FIG. 7) of the MLU circuit module 100.

Referring to FIGS. 1 and 13B, the operating point of the MLU-based current source 1330 is dependent on field line DC bias current 1333 which may be configured to be approximately at the statistical switch point. At the statistical switch point, for example, approximately 50% of the MLU's 102 have substantially parallel storage magnetization 146 and sense magnetization 144, and approximately 50% of the MLU's 102 have substantially anti-parallel storage magnetization 146 and sense magnetization 144.

Figure 14:
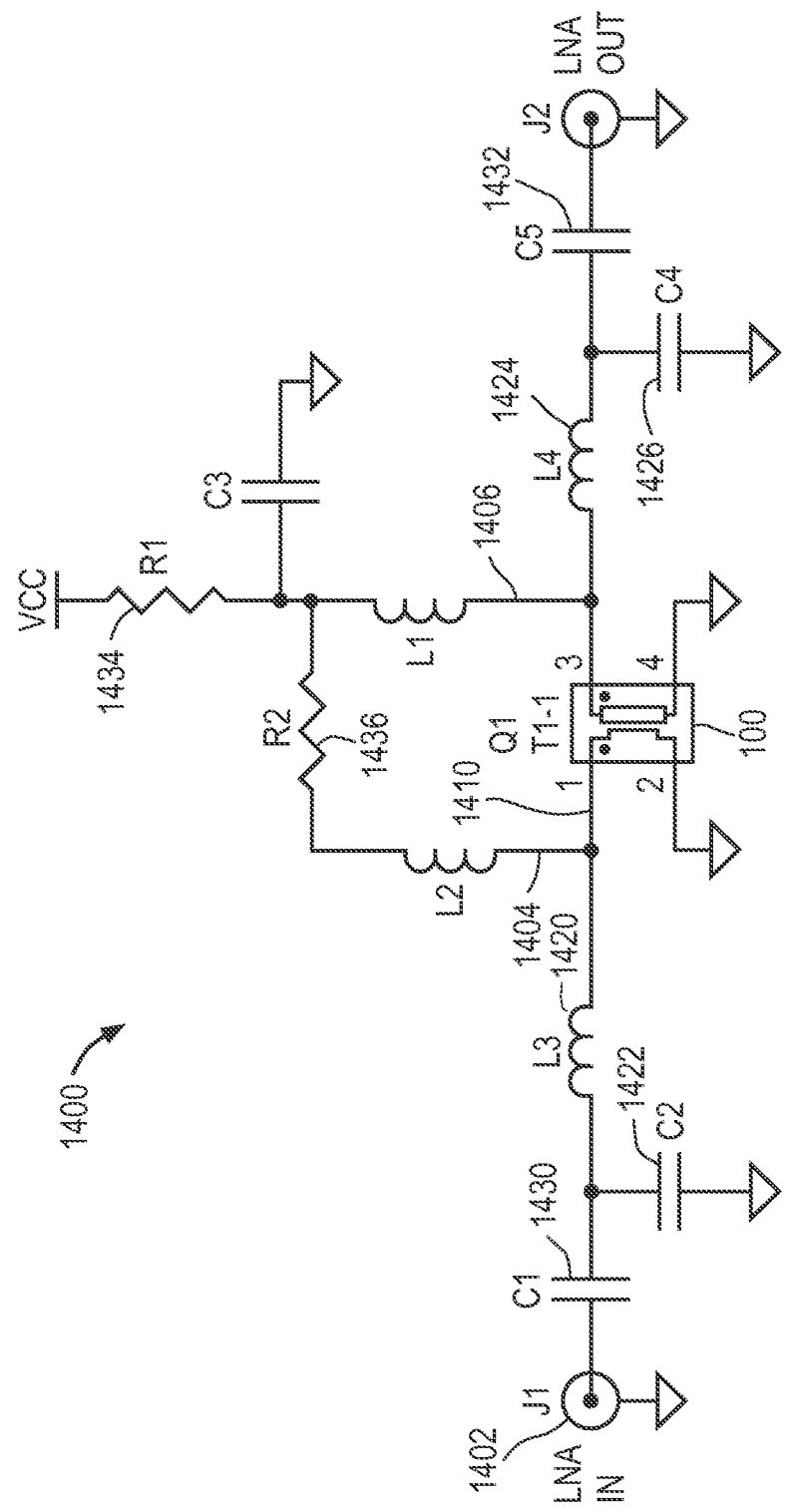
FIG. 14 illustrates an MLU-based low-noise amplifier 1400, according to an embodiment of the invention.

FIG. 14 illustrates an MLU-based low-noise amplifier 1400, according to an embodiment of the invention. An input signal 1410 to the MLU circuit module 100 is generated based on AC input current 1402 and field bias current 1404. The operating point (see description with reference to FIG. 5) is based on the field bias current 1404. In one embodiment, the operating point is within the substantially linear region 510. A bias current 1406 is provided to the MLU circuit module 100 to set the output voltage and current of the MLU-based low-noise amplifier 1400 based on Ns (the number of MLU's 102 per row in series) and Np (the number of rows of MLU's 102 in parallel). In one embodiment, the MLU circuit module 100 has Ns=10 and Np=1000. Other examples of values of Ns and Np for the MLU circuit module 100 include, but are not limited to, Ns=20 and Np=2000, and Ns=40 and Np=4000.

In one embodiment, the MLU-based low-noise amplifier 1400 includes lumped elements such as surface mounted 0402 size capacitors and inductors to implement a low-noise, 50 ohm narrowband amplifier from 40 MHz to 2500 MHz. An inductor 1420 and a capacitor 1422 provide input impedance matching. An inductor 1424 and a capacitor 1426 provide output impedance matching. Capacitors 1430 and 1432 provide DC blocking and signal coupling. Resistors 1434 and 1436 provide the field bias current 1404 and the bias current 1406 with negative feedback for bias stability.

Figure 15:
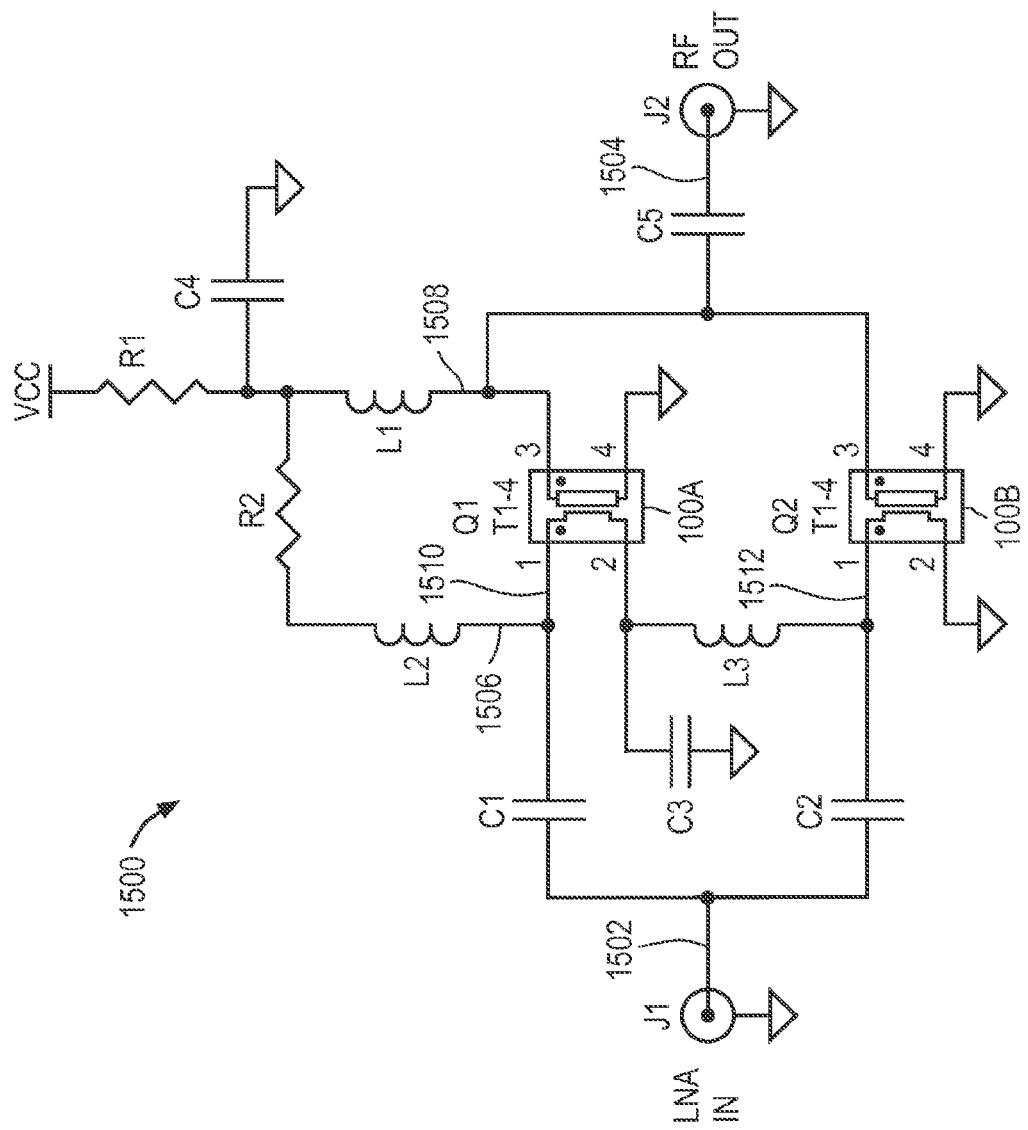
FIG. 15 illustrates an MLU-based low-noise amplifier 1500, according to an embodiment of the invention.

FIG. 15 illustrates an MLU-based low-noise amplifier 1500, according to an embodiment of the invention. In a broadband amplifier, reactive elements may not be used to match input and output impedances of the MLU circuit module 100 to characteristic system impedances. To achieve matching without the reactive elements, and potentially without any matching circuits, MLU circuit modules 100 may be configured in parallel. In one embodiment, there may be two MLU circuit modules 100 in parallel, where each of the MLU circuit modules 100 has Ns=40 and Np=4000. Alternatively, there may be more than two MLU circuit modules 100 in parallel. Other examples of values of Ns and Np for the MLU circuit module 100 include, but are not limited to, Ns=10 and Np=1000, and Ns=20 and Np=2000.

In one embodiment, field lines 1510 and 1512 are series connected for field bias current 1506 and parallel connected for input AC current 1502. The MLU circuit modules 100 are parallel connected for bias current 1508 and output AC current 1504. The operating point (see description with reference to FIG. 5) of each of the MLU circuit modules 100 is based on the field bias current 1506. In one embodiment, the operating point is within the substantially linear region 510. Because two MLU circuit modules 100 are used, the overall bias current and the dynamic range of the MLU-based low-noise amplifier 1500 may be higher than the overall bias current and the dynamic range of the MLU-based low-noise amplifier 1400 of FIG. 14.

Figure 16:
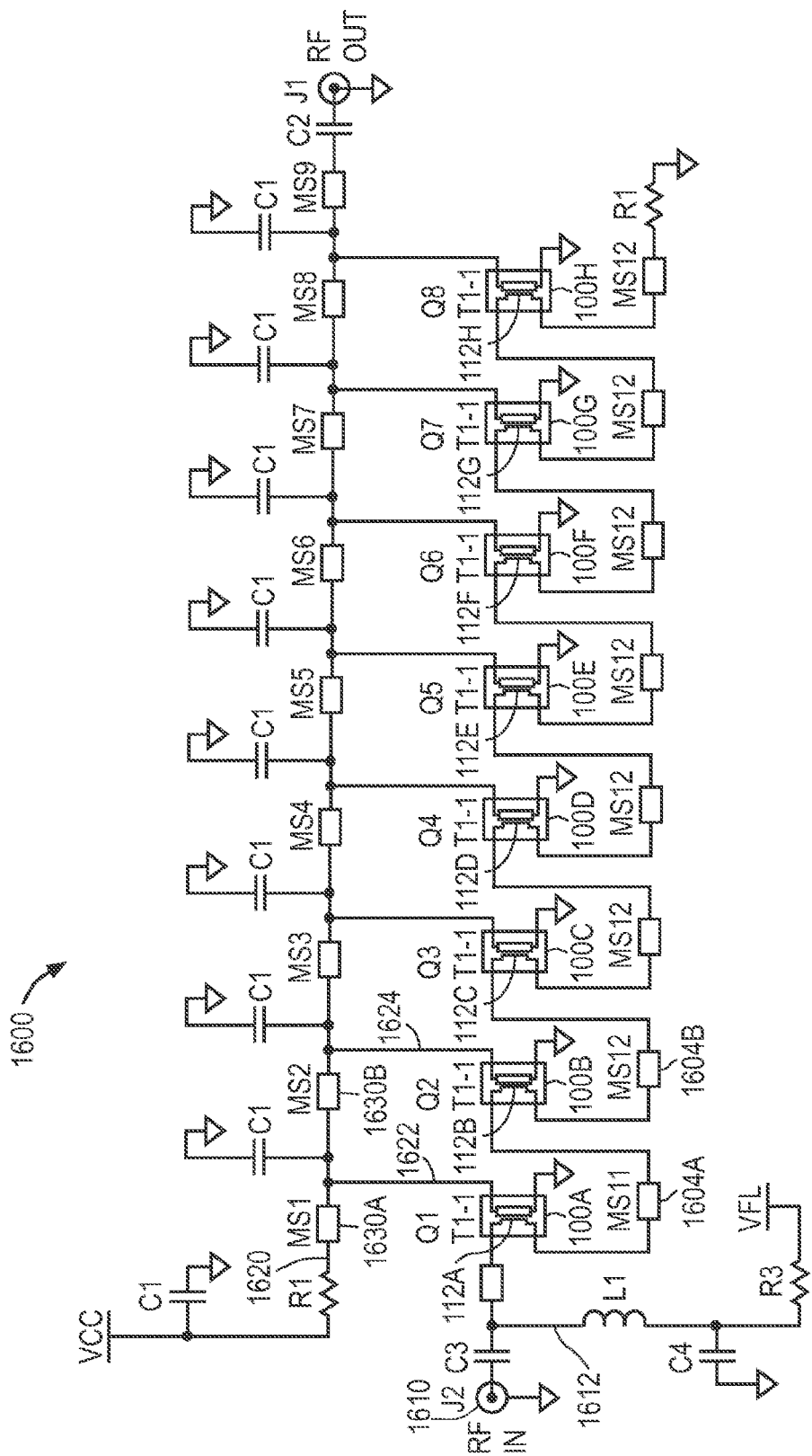
FIG. 16 illustrates an MLU-based distributed amplifier (parametric amplifier) 1600, according to an embodiment of the invention.

FIG. 16 illustrates an MLU-based distributed amplifier (parametric amplifier) 1600, according to an embodiment of the invention. The MLU-based distributed amplifier 1600 includes multiple MLU circuit modules 100A-100H connected together in sequence. Input current 1602 to field line segment 112A is based on RF input current 1610 and bias current 1612. The field line segments 112A-112H of the MLU circuit modules 100 are connected in series to form the field line 112, such that the input current 1602 to the field line segment 112A of the MLU circuit module 100A traverses the field line segment 112A, then microstrip element 1604A, then field line segment 112B of the MLU circuit module 100B, then microstrip element 1604B, and so on. The MLU circuit modules 100 are connected in parallel with reference to output bias current 1620. The output bias current 1620 traverses microstrip element 1630A to reach the MLU circuit module 100A, traverses both microstrip elements 1630A and 1630B to reach the MLU circuit module 100B, and so on. In one embodiment, each of the MLU circuit modules 100 has Ns=10 and Np=1000. Other examples of values of Ns and Np for the MLU circuit modules 100 include, but are not limited to, Ns=20 and Np=2000, and Ns=40 and Np=4000.

The field line 112 together with the connecting microstrip elements 1604 can be represented as a broadband transmission line with a series inductance associated with the field line 112. Similarly, the shunt capacitances associated with the MLU circuit modules 100 together with the connecting microstrip elements 1630 also can be represented as a broadband transmission line. The characteristic impedance of the transmission lines and the MLU circuit modules 100 can easily be adjusted to accommodate a range of source and load impedances. Because of its distributed topology, the MLU-based distributed amplifier 1600 is capable of broadband operation and high power.

Figure 17:
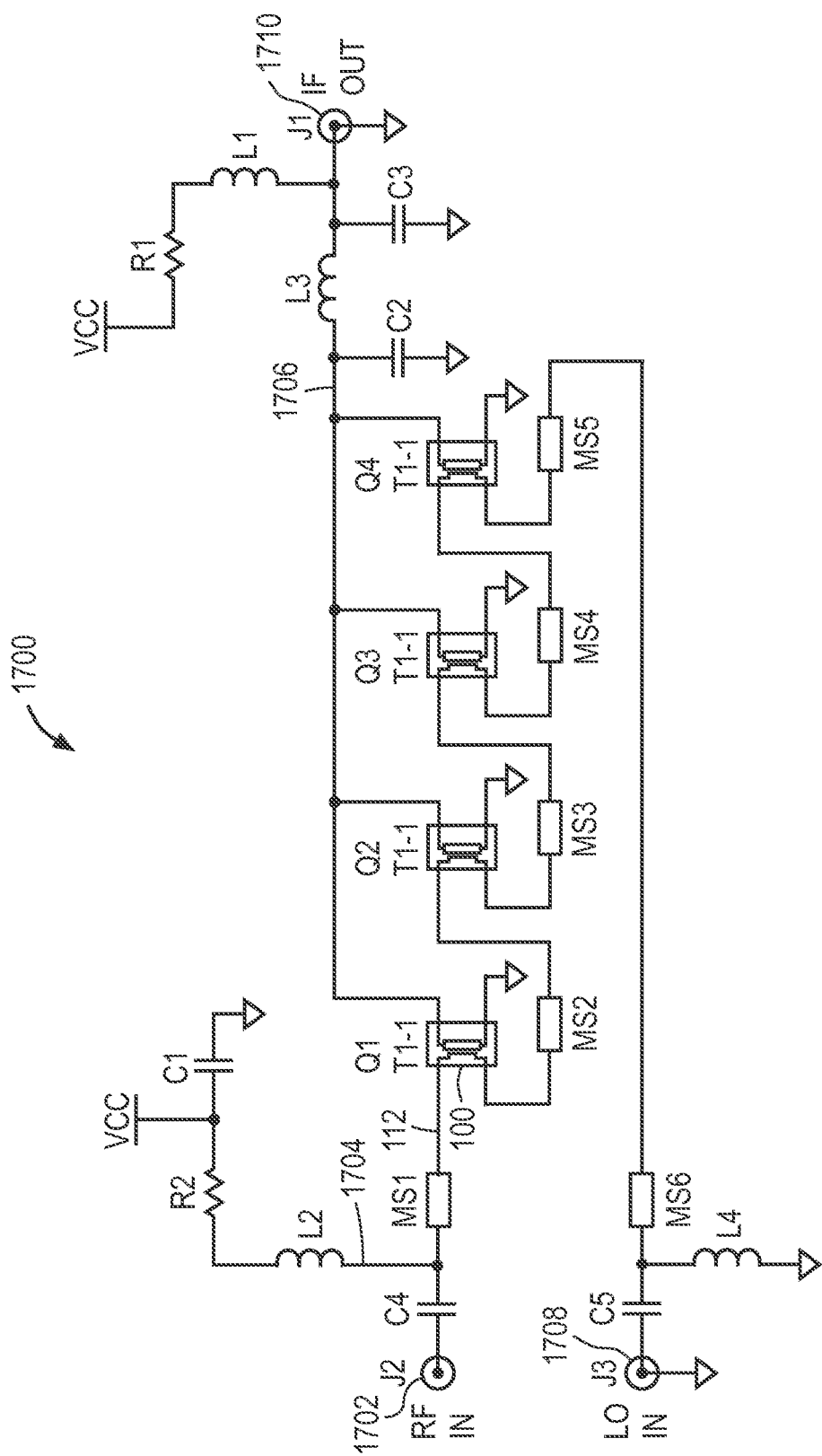
FIG. 17 is distributed mixer 1700 in which RF input current 1702 and input bias current 1704 are provided to a first input terminal, and local oscillator input current 1708 is provided to a second input terminal.

FIG. 17 illustrates an MLU-based distributed mixer 1700, according to an embodiment of the invention. The MLU-based distributed mixer 1700 mixes a first analog input 1702 (radio frequency (RF) in) and a second analog input 1708 (local oscillator (LO) in) to obtain an analog output 1710 (intermediate frequency (IF) out). The first analog input 1702 and the second analog input 1708 drive opposite ends of the field line 112. Similar to FIG. 16, the MLU circuit modules 100 are connected in series by the field line 112 such that the first analog input current 1702 and the input bias current 1704 flow through the field line 112 to traverse the MLU circuit modules 100 in series. Also similar to FIG. 16, the MLU circuit modules 100 are connected in parallel with reference to output bias current 1706. Again similar to FIG. 16, because of its distributed topology, the MLU-based distributed mixer 1700 is capable of broadband operation. In one embodiment, each of the MLU circuit modules 100 has Ns=10 and Np=1000. Other examples of values of Ns and Np for the MLU circuit modules 100 include, but are not limited to, Ns=20 and Np=2000, and Ns=40 and Np=4000.

Figure 18:
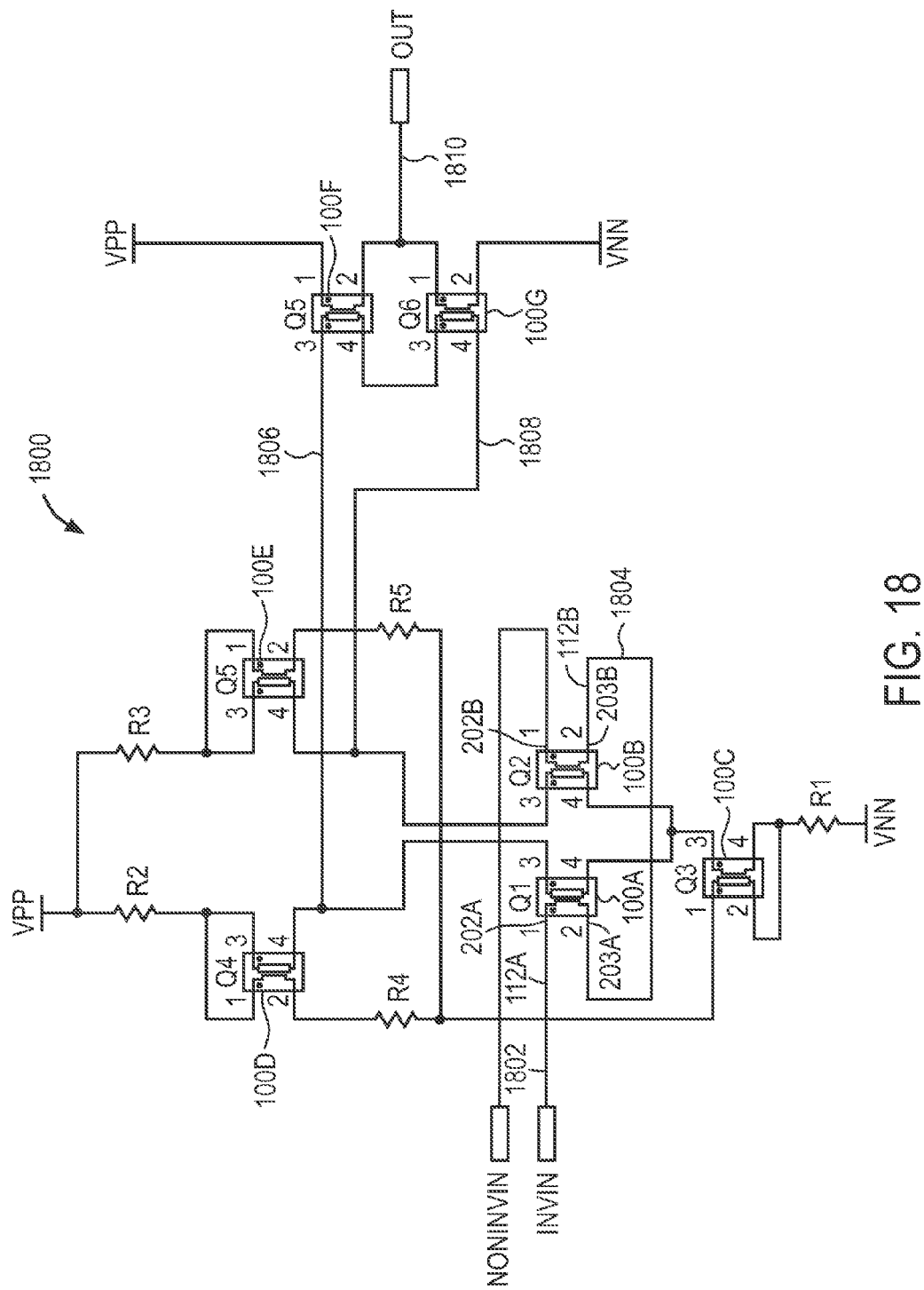
FIG. 18 is an MLU-based operational amplifier 1800 configured in accordance with an embodiment of the invention.

FIG. 18 illustrates an MLU-based operational amplifier 1800, according to an embodiment of the invention. A differential pair, MLU circuit modules 100A and 100B, provides the circuit gain. Input field line segments 112A and 112B are cross-coupled, with input current 1802 entering the MLU circuit module 100A at input terminal 202A and exiting the MLU circuit module 100A at input terminal 203A, and input current 1804 entering the MLU circuit module 100B at input terminal 202B and exiting the MLU circuit module 100B at input terminal 203B. MLU circuit module 100C is a current source for the MLU circuit modules 100A and 100B. MLU circuit modules 100D and 100E provide high impedance loads to the MLU circuit modules 100A and 100B. The output signals 1806 and 1808 from the MLU circuit modules 100A and 100B is converted to a single-ended output signal 1810 by cross-coupled, totem pole connected MLU circuit modules 100F and 100G.

A benefit of the use of the MLU circuit modules 100 in the MLU-based operational amplifier 1800 is that the cross-coupling of the input field line segments 112A and 112B of the MLU circuit modules 100A and 100B, respectively, simplify the input bias structure, as a single input bias current can be applied to both of the MLU circuit modules 100A and 100B.

Figure 19:
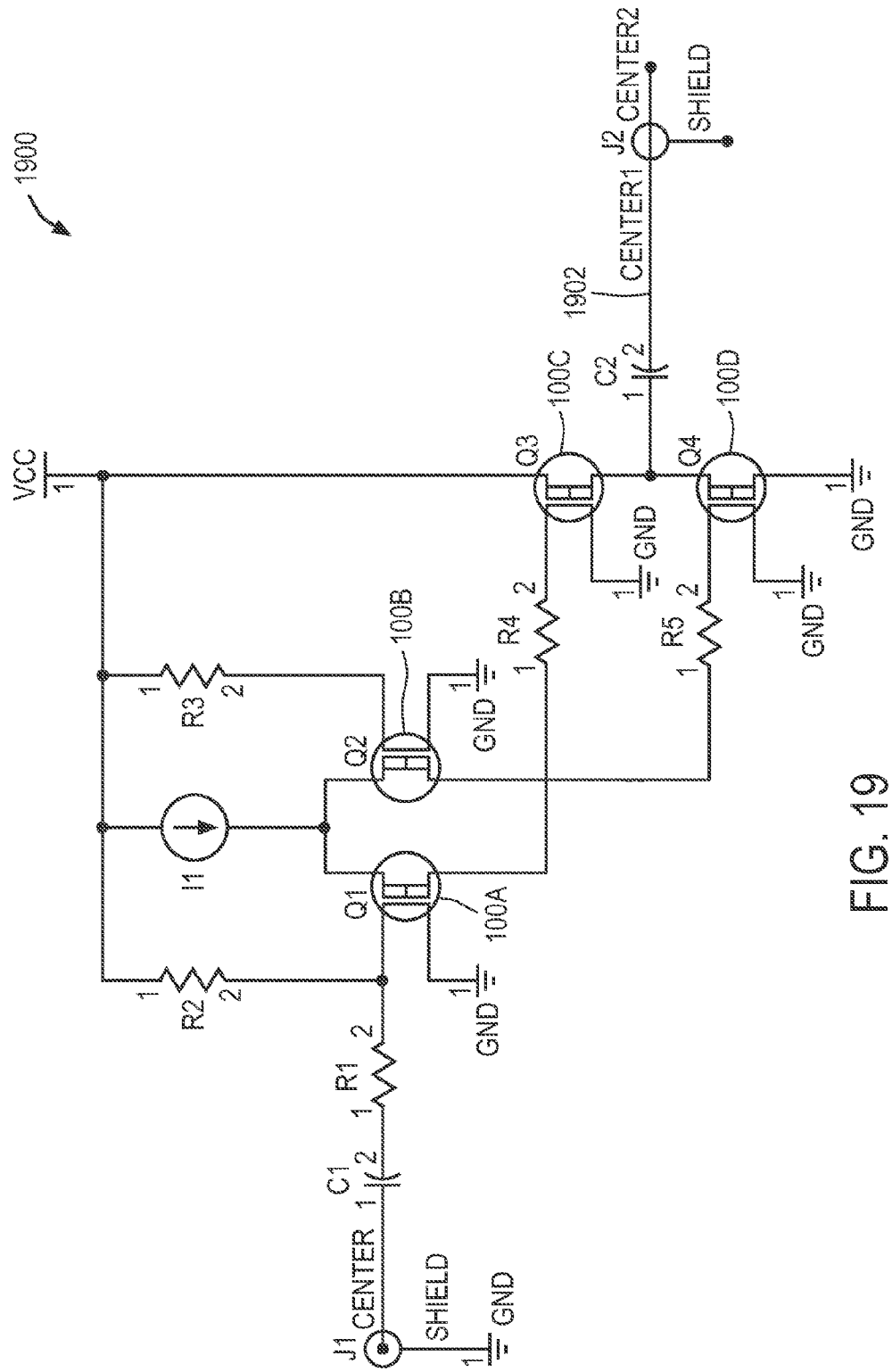
FIG. 19 illustrates MLU circuit modules 100 that have the same type of structure connected as a complementary pair of devices to form a push-pull stage 1900.

FIG. 19 illustrates an MLU-based push-pull amplifier stage 1900, according to an embodiment of the invention. A differential pair, MLU circuit modules 100A and 100B, provides the circuit gain. MLU circuit modules 100C and 100D provide push-pull functionality, with the MLU circuit module 100C sourcing output current 1902 when it flows out of the MLU-based push-pull amplifier stage 1900, and the MLU circuit module 100D sinking the output current 1902 when it flows into the MLU-based push-pull amplifier stage 1900.

Figure 20:
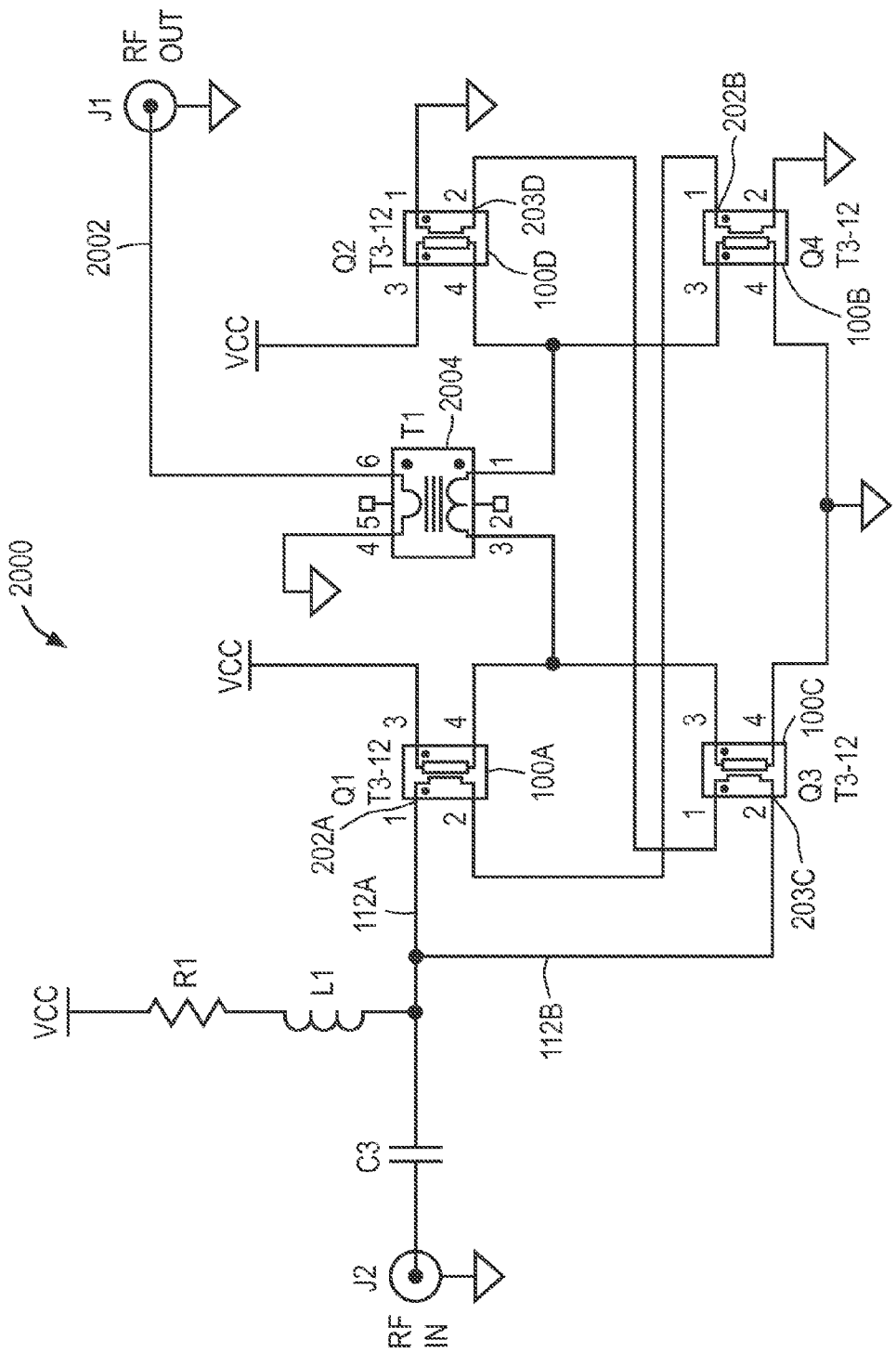
FIG. 20 illustrates an MLU-based H-bridge power amplifier 2000, according to an embodiment of the invention.

FIG. 20 illustrates an MLU-based H-bridge power amplifier 2000, according to an embodiment of the invention. Each of four MLU circuit modules 100 is an element of an H-bridge. The MLU-based H-bridge power amplifier 2000 can produce twice the power supply voltage Vcc to the load via output 2002. The load is isolated from ground by broadband RF transformer 2004. For low voltage applications, no additional isolation is needed. Also, the input current from field line 112A to input terminal 202A of MLU circuit module 100A and to input terminal 202B of MLU circuit module 100B has a first polarity. The input current from field line 112B to input terminal 203C of MLU circuit module 100C and to input terminal 203D of MLU circuit module 100D has a second polarity that is opposite to the first polarity. For this reason, opposite pairs of MLU circuit modules (100A and 100B; 100C and 100D) can be series connected, and adjacent pairs of MLU circuit modules (100A and 100C; 100B and 100D) can be cross-connected in order to provide a drive signal with a correct phase to the four H-bridge elements (MLU circuit modules 100A-100D). This circuit can provide high-power, broadband RF amplification in, for example, the 1 GHz to 100 GHz range from a low power supply voltage.

The use of the MLU circuit module 100 in the MLU-based H-bridge power amplifier 2000 has various benefits. First, H-bridge amplifier circuits using bipolar junction transistors typically include additional transformers that isolate the drive circuit for the top pair of active devices. Because the field lines 112 of the MLU circuit modules 100 are isolated from output terminals 204 and 206 (see FIG. 2) of the MLU circuit modules 100, these additional transformers are not needed in the MLU-based H-bridge power amplifier 2000. Second, a differential drive signal (including in-phase and anti-phase drive signals) is typically needed for the H-bridge. Because the field lines 112 of the MLU circuit modules 100 are isolated from output terminals 204 and 206 (see FIG. 2) of the MLU circuit modules 100, and because the MLU circuit modules 100 are four-terminal devices, the anti-phase drive signal can be obtained from connecting the field lines 112 in the manner shown in FIG. 20, without additional circuit components.

Figure 21:
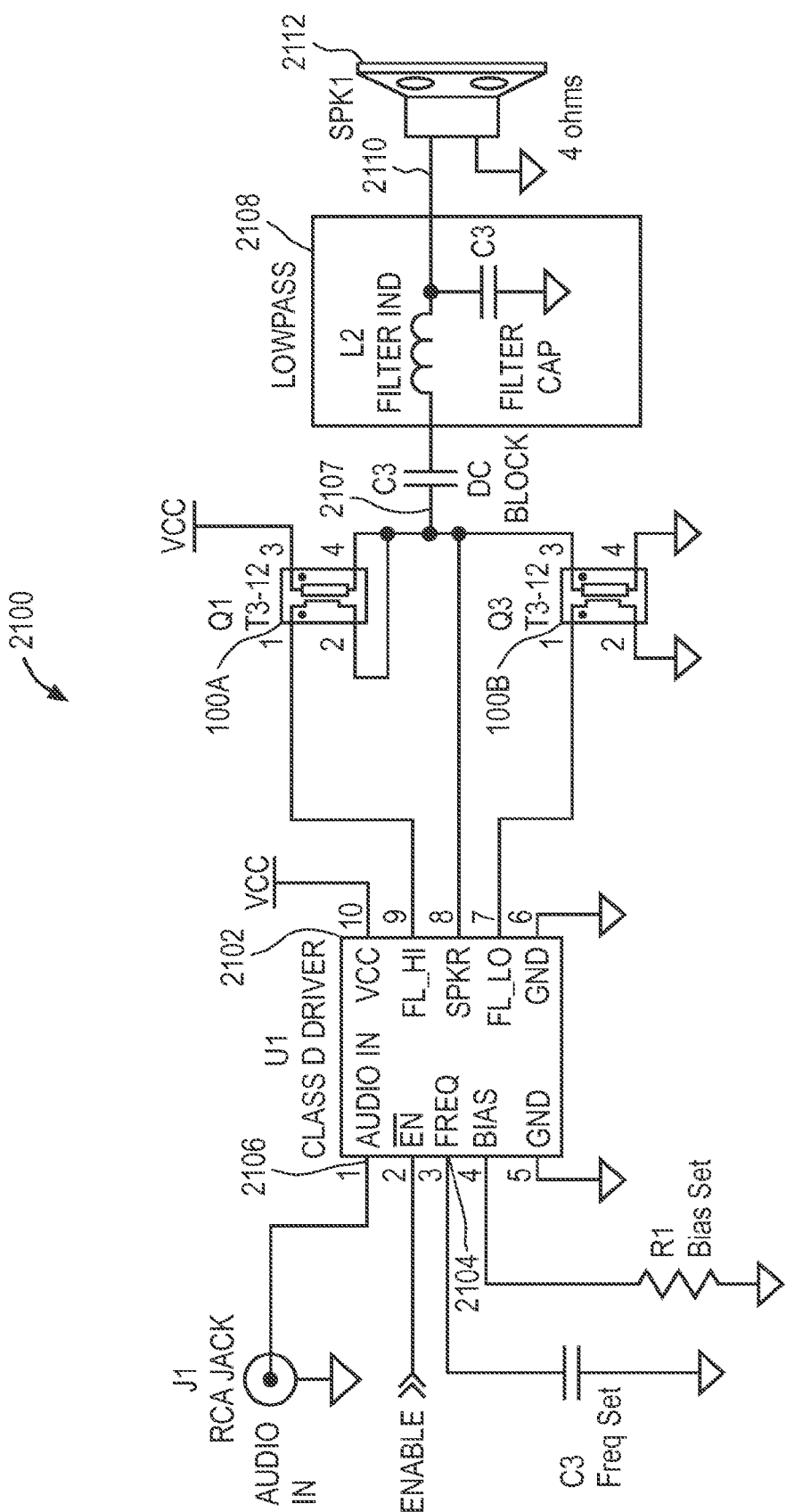
FIG. 21 illustrates an MLU-based Class-D audio power amplifier 2100, according to an embodiment of the invention.

FIG. 21 illustrates an MLU-based Class-D audio power amplifier 2100, according to an embodiment of the invention. The MLU-based Class-D audio power amplifier 2100 includes a Class-D audio controller 2102 known to one of ordinary skill in the art. A class-D controller pulse width modulates an ultrasonic carrier frequency (input 2104 to the FREQ pin of the audio controller 2102) with an audio signal (input 2106 to the AUDIO IN pin of the audio controller 2102). This pulse width modulated signal is sent to a pair of MLU circuit modules 100A and 100B configured as a half-bridge Class D driver. The MLU circuit modules 100A and 100B operate in either saturation mode or cut-off mode resulting in high efficiency. An output 2107 of the half-bridge Class D driver is filtered by L/C filter 2108 to remove the ultrasonic carrier so that only audio current 2110 drives low impedance speaker 2112.

Figure 22:
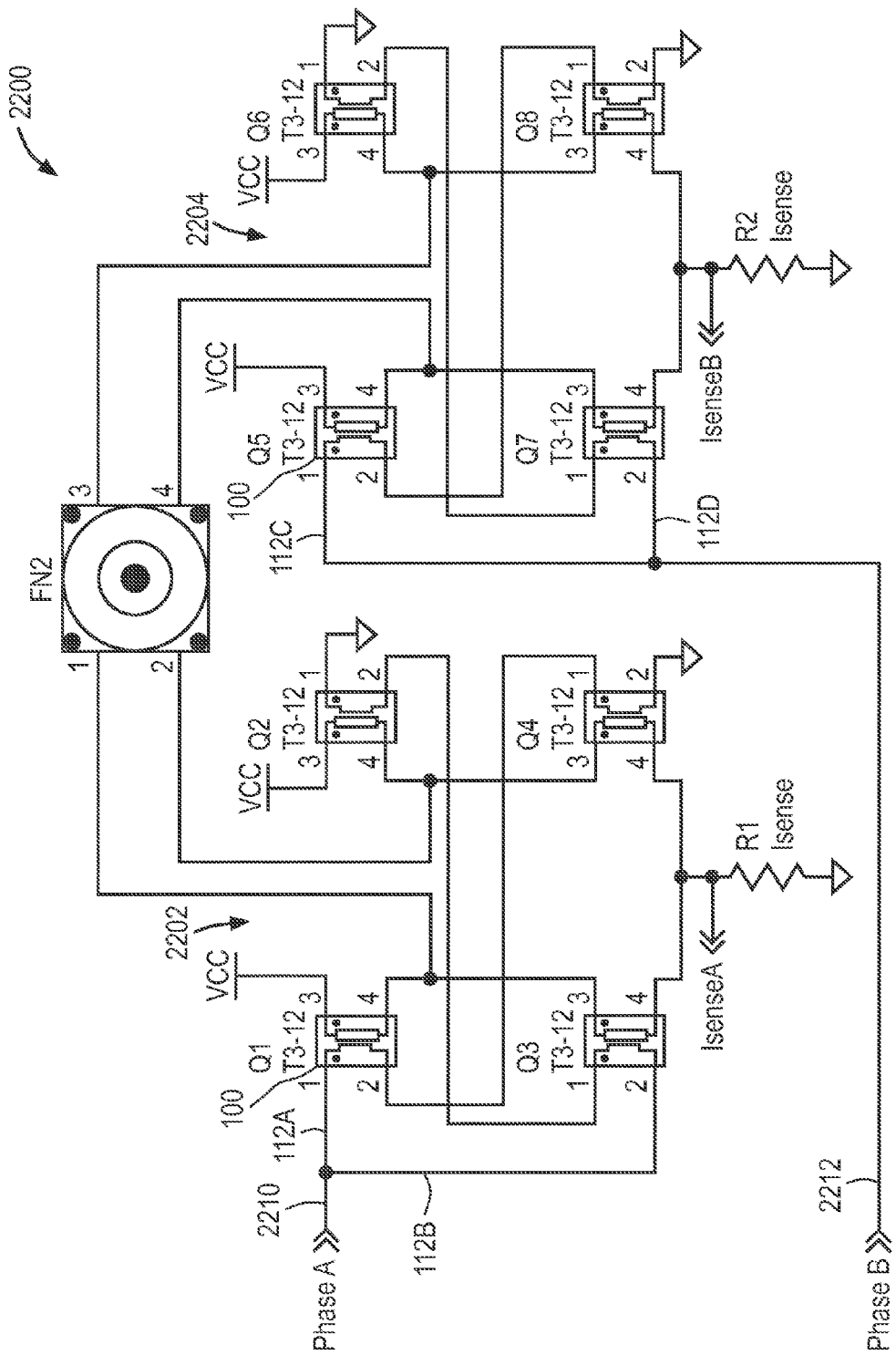
FIG. 22 illustrates an MLU-based stepper motor driver 2200, according to an embodiment of the invention.

FIG. 22 illustrates an MLU-based stepper motor driver 2200, according to an embodiment of the invention. MLU circuit modules 100 can be sized to drive stepper motors. In the example of FIG. 22, the MLU-based stepper motor driver 2200 is a bipolar stepper motor driver including inputs 2210 and 2212 for two phases. In another embodiment, the MLU-based stepper motor driver 2200 may be a unipolar driver.

The use of the MLU circuit module 100 in the MLU-based stepper motor driver 2200 instead of conventional active devices has various benefits. A differential drive signal (including in-phase and anti-phase drive signals) is typically needed for the H-bridges 2202 and 2204. Because the field lines 112 of the MLU circuit modules 100 are isolated from output terminals 204 and 206 (see FIG. 2) of the MLU circuit modules 100, and because the MLU circuit modules 100 are four-terminal devices, the anti-phase drive signal can be obtained from connecting the field lines 112 in the manner shown in FIG. 22, without additional circuit components.

Figure 23:
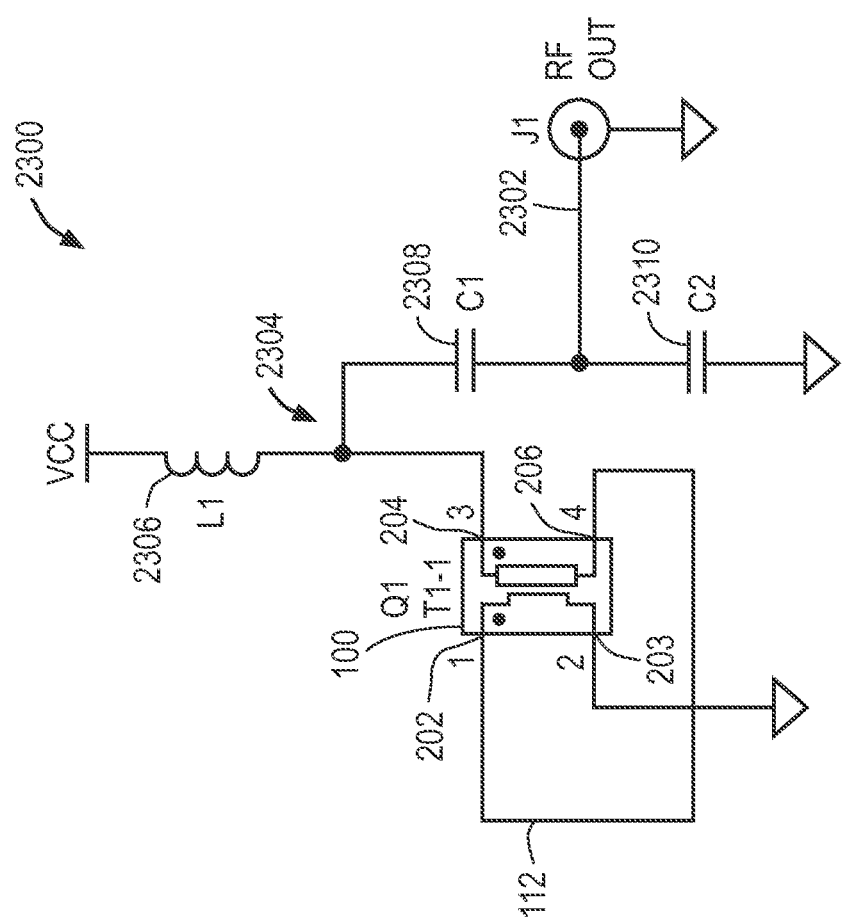
FIG. 23 illustrates an MLU circuit module 100 configured as an oscillator 2300.

FIG. 23 illustrates an MLU-based oscillator 2300, according to an embodiment of the invention. The MLU-based oscillator 2300 includes MLU circuit module 100 with field line 112 connected to output terminal 206 as well as input terminals 202 and 203, such that the field line 112 is reverse connected to the MTJs 102 (see FIG. 7) included in the MLU circuit module 100. Output terminal 204 of the MLU circuit module 100 is available to connect to RF output 2302 and to a parallel resonant tank circuit 2304 including inductor 2306 and a series combination of capacitors 2308 and 2310. Since the MLU circuit module 100 is a four-terminal device, the phase reversal typically associated with oscillators can be achieved through the reverse connection of the field line 112 to the output terminal 206. A negative resistance can be developed at the output terminal 204, such that a resonant circuit connected to the output terminal 204 oscillates if the losses in the resonant circuit are less than or equal to the negative resistance. In the example of FIG. 23, the MLU-based oscillator 2300 includes a resonant tank circuit in lumped-element form. Alternatively, the MLU-based oscillator 2300 may include a resonant tank circuit including distributed inductances and capacitances. In one embodiment, each of the MLU circuit modules 100 has Ns=10 and Np=1000. Other examples of values of Ns and Np for the MLU circuit modules 100 include, but are not limited to, Ns=20 and Np=2000, and Ns=40 and Np=4000.

Figure 24:
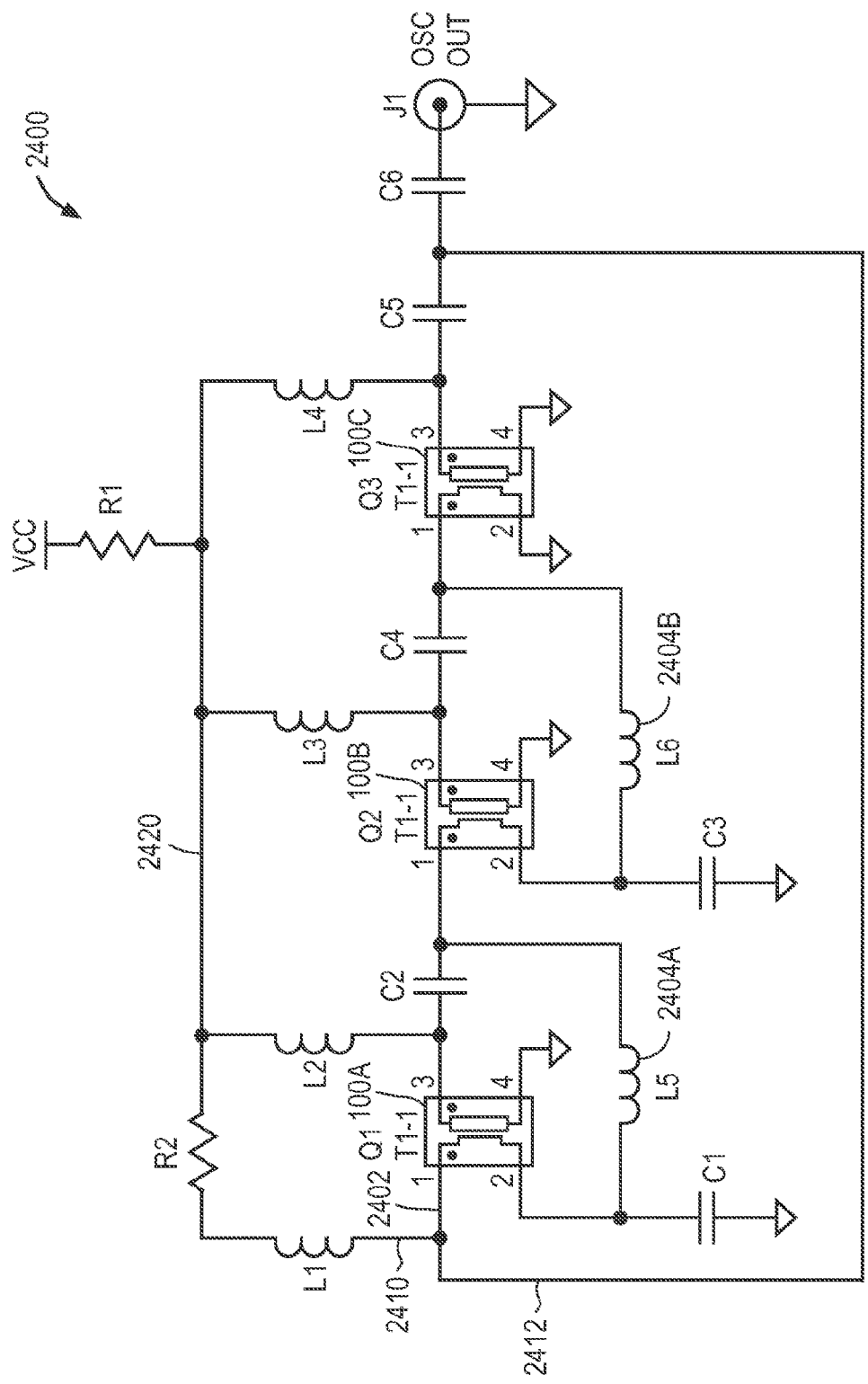
FIG. 24 illustrates an MLU-based ring oscillator 2400, according to an embodiment of the invention.

FIG. 24 illustrates an MLU-based ring oscillator 2400, according to an embodiment of the invention. Ring oscillators typically rely on element and parasitic delays around a circuit to provide gain and phase feedback to sustain oscillation. Ring oscillators can be integrated in monolithic integrated circuits and can oscillate at a frequency close to a cutoff frequency of active devices included in the ring oscillator.

The MLU-based ring oscillator 2400 includes multiple MLU circuit modules 100 connected together in sequence. In one embodiment, the MLU-based ring oscillator 2400 includes three MLU circuit modules 100A-100C, though MLU-based ring oscillators 2400 with larger odd numbers of MLU circuit modules 100 such as five or seven are contemplated. Field line segments 112A-112C of the MLU circuit modules 100 are connected in series to form the field line 112, such that input current 2402 to the field line segment 112A of the MLU circuit module 100A traverses the field line segment 112A, then inductor 2404A, then field line segment 112B of the MLU circuit module 100B, then inductor 2404B, then field line segment 112C of the MLU circuit module 100C. The input current 2402 includes input bias current 2410 and feedback current 2412. The MLU circuit modules 100 are connected in parallel with reference to output bias current 2420. In one embodiment, each of the MLU circuit modules 100 has Ns=10 and Np=1000. Other examples of values of Ns and Np for the MLU circuit modules 100 include, but are not limited to, Ns=20 and Np=2000, and Ns=40 and Np=4000.

In the embodiment of FIG. 24, each MLU has a 180-degree phase shift, so a total phase shift across the MLU circuit modules 100A-100C is 540 degrees. With a slight additional phase shift provided by parasitic elements, oscillation can be sustained.

Figure 25:
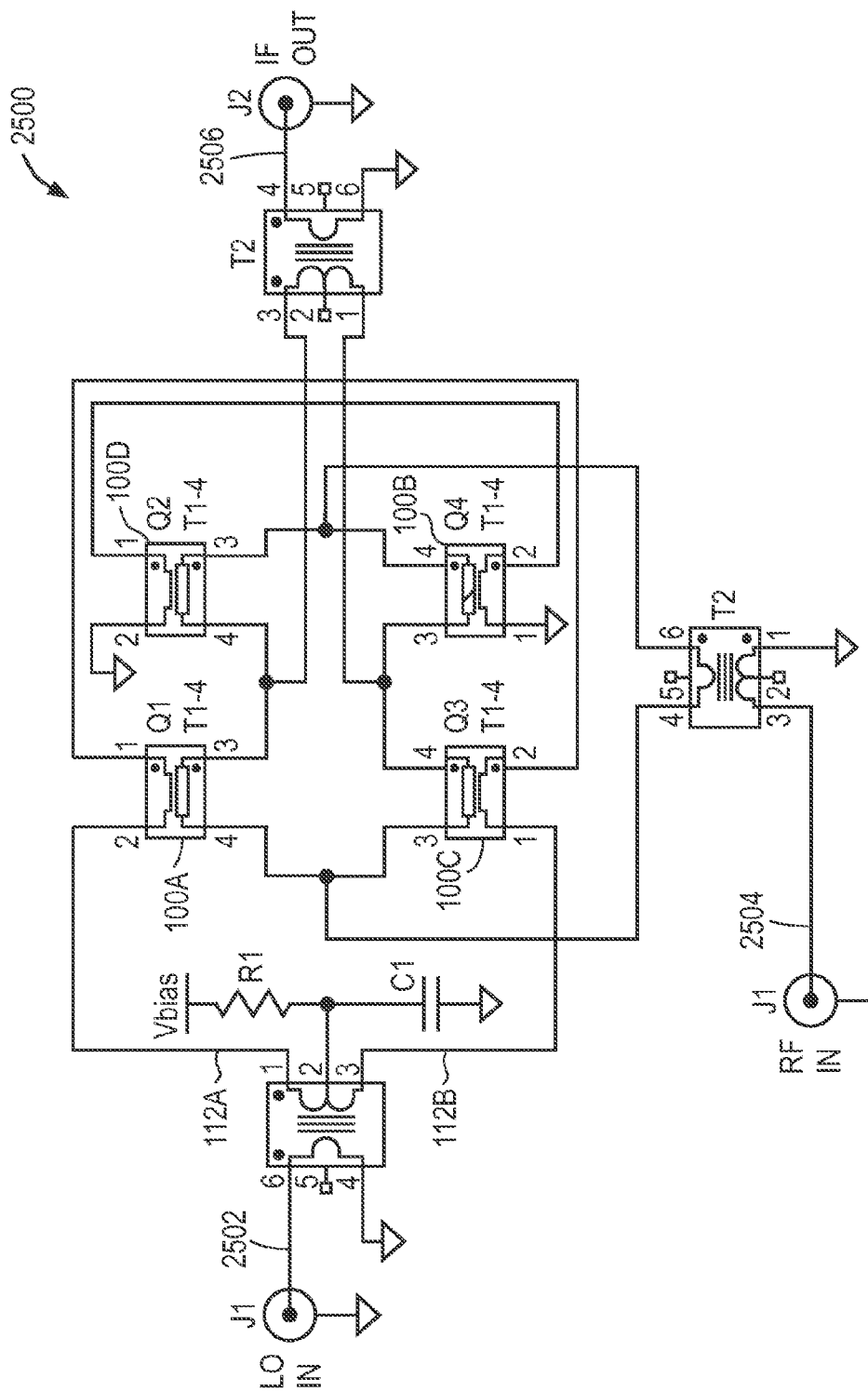
FIG. 25 illustrates an MLU-based ring mixer 2500, according to an embodiment of the invention.

FIG. 25 illustrates an MLU-based ring mixer 2500, according to an embodiment of the invention. The MLU-based ring mixer 2500 operates in the microwave frequency range. The MLU-based ring mixer 2500 includes MLU-based circuit modules 100A-100D connected in a bridge configuration. The MLU-based circuit modules 100 are configured as resistive switches. A local oscillator signal is applied to field lines 112A and 112B. The input terminals 202 and 203 (see FIG. 2) of opposite pairs of MLU circuit modules (100A and 100B; 100C and 100D) can be series connected by the field lines 112A and 112B, respectively. An RF signal 2504 is connected to one of the output terminals 204 and 206 (see FIG. 2) of each of the MLU circuit modules 100. An output IF signal 2506 is connected to the other of the output terminals 204 and 206 of the each of the MLU circuit modules 100. In one embodiment, each of the MLU circuit modules 100 has Ns=40 and Np=4000. Other examples of values of Ns and Np for the MLU circuit modules 100 include, but are not limited to, Ns=10 and Np=1000, and Ns=20 and Np=2000.

While the invention has been described with reference to the specific embodiments thereof, it should be understood by those skilled in the art that various changes may be made and equivalents may be substituted without departing from the true spirit and scope of the invention as defined by the appended claims. In addition, many modifications may be made to adapt a particular situation, material, composition of matter, method, or process to the objective, spirit and scope of the invention. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A circuit, comprising:
a magnetic logic unit including:
a plurality of terminals including a first input terminal, a second input terminal, a first output terminal, and a second output terminal;
a field line that electrically connects the first input terminal and the second input terminal, the field line being configured to generate a magnetic field based on an input to the first input terminal, the input being based on a first analog input to the circuit; and
a plurality of magnetic tunnel junctions, wherein each of the plurality of magnetic tunnel junctions is electrically connected to the first output terminal and the second output terminal, and is configured such that an output of the second output terminal varies in response to a combined resistance of the plurality of magnetic tunnel junctions, wherein the resistance of the each of the plurality of magnetic tunnel junctions varies based on the magnetic field;
wherein the circuit is configured to mix the first analog input and a second analog input to generate an analog output based on the output of the second output terminal.

2. The circuit of claim 1, wherein the magnetic logic unit is configured such that the circuit is a distributed mixer.

3. The circuit of claim 1, wherein:
an input to the second input terminal is based on the second analog input; and
the field line is configured to generate the magnetic field based on the input to the first input terminal and the input to the second input terminal.

4. The circuit of claim 1, wherein the magnetic logic unit is configured such that the circuit is a ring mixer.

5. The circuit of claim 1, further comprising bias circuitry connected to the first output terminal, wherein a bias current applied to the first output terminal is based on the second analog input.

6. The circuit of claim 1, wherein no terminal in the plurality of terminals is in common with any other terminal in the plurality of terminals.

7. The circuit of claim 1, wherein:
the magnetic logic unit is configured such that the circuit is configured to be a non-linear analog circuit; and
the analog output is continuously varying.

8. The circuit of claim 1, wherein:
at least one of the plurality of magnetic tunnel junctions includes a storage layer and a sense layer; and
a magnetization direction of the storage layer is pinned during processing by the circuit.

9. The circuit of claim 1, wherein:
at least one of the plurality of magnetic tunnel junctions includes a storage layer and a sense layer; and
a magnetization direction of the storage layer is pre-configured; and
a direction of current flow through the field line is configurable such that the magnetization direction of the sense layer is switchable based on the current flow through the field line.

10. A circuit, comprising:
a magnetic logic unit including:
a plurality of terminals including a first input terminal, a second input terminal, a first output terminal, and a second output terminal;
a field line that is electrically connected to the first input terminal and the second input terminal, the field line being configured to generate a magnetic field based on an input to the first input terminal; and a plurality of magnetic tunnel junctions, wherein each of the plurality of magnetic tunnel junctions is electrically connected to the first output terminal and to the second output terminal, and is configured such that a resistance of the each of the plurality of magnetic tunnel junctions varies based on the magnetic field;

wherein the circuit is configured such that an output of the second output terminal is applied as the input to the first input terminal; and wherein the circuit is configured as an oscillator.

11. The circuit of claim 10, wherein no terminal in the plurality of terminals is in common with any other terminal in the plurality of terminals.

12. The circuit of claim 10, wherein:

the magnetic logic unit is configured such that the circuit is configured to be a non-linear analog circuit; and an analog output of the circuit is continuously varying.

13. The circuit of claim 10, wherein:

at least one of the plurality of magnetic tunnel junctions includes a storage layer and a sense layer; and a magnetization direction of the storage layer is pinned during processing by the circuit.

14. The circuit of claim 10, wherein:

at least one of the plurality of magnetic tunnel junctions includes a storage layer and a sense layer; and a magnetization direction of the storage layer is pre-configured; and a direction of current flow through the field line is configurable such that the magnetization direction of the sense layer is switchable based on the current flow through the field line.

15. A circuit, comprising:

a plurality of magnetic logic units, each of the plurality of magnetic logic units including:

a plurality of terminals including a first input terminal, a second input terminal, a first output terminal, and a second output terminal;

a field line that is electrically connected to the first input terminal and the second input terminal, the field line being configured to generate a magnetic field based on an input to the first input terminal; and a plurality of magnetic tunnel junctions, wherein each of the plurality of magnetic tunnel junctions is electrically connected to the first output terminal and to the second output terminal, and is configured such that a resistance of the each of the plurality of magnetic tunnel junctions varies based on the magnetic field;

wherein the circuit is configured such that the second input terminal of a first one of the plurality of magnetic logic units is electrically connected to the first input terminal of a second one of the plurality of magnetic logic units; and wherein the circuit is configured as a ring oscillator.

16. The circuit of claim 15, wherein no terminal in the plurality of terminals is in common with any other terminal in the plurality of terminals.

17. The circuit of claim 15, wherein:

the magnetic logic unit is configured such that the circuit is configured to be a non-linear analog circuit; and an analog output of the circuit is continuously varying.

18. The circuit of claim 15, wherein:

at least one of the plurality of magnetic tunnel junctions includes a storage layer and a sense layer; and a magnetization direction of the storage layer is pinned during processing by the circuit.

19. The circuit of claim 15, wherein:

at least one of the plurality of magnetic tunnel junctions includes a storage layer and a sense layer; and a magnetization direction of the storage layer is pre-configured; and a direction of current flow through the field line is configurable such that the magnetization direction of the sense layer is switchable based on the current flow through the field line.

* * * * *